(12) United States Patent
Song et al.

(10) Patent No.: US 8,774,220 B2
(45) Date of Patent: Jul. 8, 2014

(54) METHOD OF PACKETIZING ENCODED SYMBOLS AND APPARATUS USING THE SAME

(75) Inventors: Hwang Jun Song, Gyeongbuk (KR); Wan Kim, Gyeongbuk (KR); Jin Woo Hong, Daejeon (KR); Hyung Rai Oh, Gyeongbuk (KR); Ki Ung Jung, Daejeon (KR); Jong Soo Lim, Seoul (KR); Dong Ju Lee, Busan (KP); Hyun Chul Joo, Gyeongbuk (KR)

(73) Assignees: Postech Academy-Industry Foundation, Pohang-si (KR); Electronics & Telecommunications Research Institute, Daejeon (KR)

( * ) Notice: Subject to any disclaimer, the term of this patent is extended or adjusted under 35 U.S.C. 154(b) by 274 days.

(21) Appl. No.: 13/297,071

(22) Filed: Nov. 15, 2011

(65) Prior Publication Data

US 2012/0134373 A1    May 31, 2012

(30) Foreign Application Priority Data

Nov. 30, 2010  (KR) .................. 10-2010-0120737

(51) Int. Cl.
 *H04J 3/24* (2006.01)
 *H04L 1/00* (2006.01)
 *H03M 13/37* (2006.01)
(52) U.S. Cl.
 CPC ............ *H04L 1/0041* (2013.01); *H04L 1/0056* (2013.01); *H03M 13/3761* (2013.01)
 USPC ........................................................ 370/474
(58) Field of Classification Search
 None
 See application file for complete search history.

(56) References Cited

U.S. PATENT DOCUMENTS

| 2009/0040080 A1* | 2/2009 | Hwang et al. .................. 341/51 |
| 2009/0055705 A1* | 2/2009 | Gao ............................... 714/755 |
| 2009/0210693 A1* | 8/2009 | Gentric .......................... 713/150 |

FOREIGN PATENT DOCUMENTS

| KR | 10-2008-0093924 A | 10/2008 |
| KR | 10-2009-0012188 A | 2/2009 |
| KR | 10-2010-0044685 A | 4/2010 |

OTHER PUBLICATIONS

"Why Digital Fountain's Raptor Code is Better Than Reed-Solomon Erasure Codes for Streaming Applications", Digital Fountain, Inc., Jan. 2005 (19 pages).

(Continued)

*Primary Examiner* — Minh-Trang Nguyen
(74) *Attorney, Agent, or Firm* — H.C. Park & Associates, PLC

(57) ABSTRACT

Provided are a method of packetizing encoded symbols and an apparatus using the same. The method includes an encoded symbol and target packet selection step of deciding a first source symbol and selecting an unpacketized first encoded symbol and a target packet into which the unpacketized first encoded symbol is inserted if there is the unpacketized first encoded symbol of at least one first encoded symbol, which is an encoded symbol of the first source symbol generated using an AND-OR tree structure, and a packetization step of generating a second source symbol based on at least one unpacketized first encoded symbol by use of the AND-OR tree structure, generating at least one second encoded symbol based on the second source symbol by use of the AND-OR tree structure, and packetizing at least one of second encoded symbols into the target packet along with the first encoded symbol.

13 Claims, 15 Drawing Sheets

(56) References Cited

OTHER PUBLICATIONS

Luby, Michael, "Application-layer FEC Erasure Codes and Cellular Multicast/broadcast Standards", Digital Fountain, Oct. 31, 2005, 45 pages.

"DF Raptor Technology", Digital Fountain, Feb. 6, 2007, 6 pages.

"How DF Raptor is Used in MBMS", Digital Fountain, Mar. 2007, 14 pages.

Korean Patent Abstract XML; Publication No. 10-2008-0093924A dated Oct. 22, 2008 (1 page).

Korean Patent Abstract XML; Publication No. 10-2009-0012188A dated Feb. 2, 2009 (2 pages).

Korean Patent Abstract XML; Publication No. 10-2010-0044685A dated Apr. 30, 2010 (1 page).

Argryropoulos, S., Tan, A.S., Thomos, N., Arikan, E., and Strintzis, M.G; "Robust Transmission of Multi-View Video Streams Using Flexible Macroblock Ordering and Systematic LT Codes;" 3DTV Conference, May 2007 (4 pages).

Sejdinovic, D., Piechocki, R.J., and Doufexi, A; "AND-OR Tree Analysis of Distributed LT Codes;" IEEE Information Theory Workshop on Networking and Information Theory, Jun. 2009 (5 pages).

Office Action in Japanese Patent Application No. 2011-248963 dated Jun. 11, 2013 (4 pages).

\* cited by examiner

METHOD OF PACKETIZING ENCODED SYMBOLS AND APPARATUS USING THE SAME

CLAIM FOR PRIORITY

This application claims priority to Korean Patent Application No. 10-2010-0120737 filed on Nov. 30, 2010 in the Korean Intellectual Property Office (KIPO), the entire contents of which are hereby incorporated by reference.

BACKGROUND

1. Technical Field

Example embodiments of the present invention relate in general to a method of packetizing symbols and an apparatus using the same, and more particularly, to a method of packetizing encoded symbols and an apparatus using the same.

2. Related Art

In fields of studying networks and video coding, video streaming technology is important. There is a problem in that it is difficult to transmit video streaming traffic in an actual network environment because a video not only has a large amount of data, but also requires quality of service (QoS) of data.

It is essential to use an effective video compression algorithm so as to reduce a volume of video data in video streaming.

Heretofore, digital video coding technology for an effective video compression algorithm has been rapidly developing. International standards such as Moving Picture Experts Group (MPEG)-1, 2, and 4, H.261, H.263/+/++, and H.264 have been proposed to satisfy various requirements of the International Organization for Standardization/International Electrotechnical Commission (ISO/IEC) and International Telecommunication Union-Telecommunication Standardization Sector (ITU-T). Compressed video data has various bit rates because of entropy encoder characteristics, video scene changes, and irregular motion variations. Transmission errors and loss occur more easily in video data compressed at a high compression rate than in video data compressed at a low compression rate.

A problem to be solved is to effectively provide high-quality stable video streaming service in a wireless network.

Path loss, fading, multipath, and interference in video data transmission lead to an irregular variation in a signal-to-noise ratio (SNR) of video data received in a radio link.

It is difficult to decode a received signal at a low SNR, so that a bit error rate (BER) increases. An automatic repeat request (ARQ) and forward error correction (FEC) are widely used to reduce data transmission errors and loss in the wireless network.

In the ARQ, a delay increases because lost data should be retransmitted after feedback information is received. As an error prevention method, the ARQ may not be suitable for video streaming sensitive to a delay.

However, the FEC requires additional data for compensating for data loss and errors without requiring feedback information in the network. Characteristics of the FEC are suitable for video streaming sensitive to a delay, as compared to those of the ARQ method.

Fountain codes such as Luby transform (LT), raptor, and on-line codes are block-based FEC technology. Because the fountain codes have characteristics such as high coding efficiency, a short encoding/decoding processing time, and adaptability, the fountain codes are very useful in transmitting delay-sensitive data in an error-prone wireless network.

As rateless codes of channel coding, the fountain codes advantageously make error-free perfect reception possible only in one-way transmission when two-way information transmission is difficult as in the case where information regarding a reception end is insufficient in a side of a transmission end or the number of reception ends is very large.

Previously, the fountain codes have been studied for an erasure channel and actively applied to other channels. The erasure channel is a channel of which information is erased at a predetermined probability, regardless of transmitted information, and on which what is transmitted is not recognizable. Although the erasure channel has only been recognized as a theoretical virtual channel, the erasure channel has recently received attention as a channel capable of modeling the Internet with the development of the Internet.

Because an application is made only in the case where packets are accurately transmitted on the Internet or accurately received or discarded at a predetermined probability, regardless of which packet is transmitted, an Internet channel environment may be modeled as an erasure channel.

The standardization of the fountain codes is being studied in various fields. Until now, raptor codes from 2005 have been adopted in a channel encoding algorithm for standard broadcasting used in 3rd Generation Partnership Project (3GPP) Technical Specification (TS) 26.346 multimedia broadcast/multicast service (MBMS) and digital video broadcasting-handheld (DVB-H) Internet protocol (IP) datacast. Raptor codes used in a standard are defined to have systematic characteristics. In a pre-coding process, LT decoding is used to implement raptor codes having the above-described characteristics in 3GPP MBMS and DVB-H. That is, existing source symbols are assumed as symbols encoded by the same source symbol selection pattern as that of LT code parts of raptor codes. Accordingly, if a middle-step symbol obtained by LT decoding is LT-encoded, a source symbol may be directly included within an encoded symbol to be transmitted.

The fountain codes are also suitable for communication on a wired network because the fountain codes are basically designed to operate in the erasure channel. Also, in wireless communication, the fountain codes may be regarded as in the erasure channel and applied because it is only determined whether or not a received packet is correct information by applying a cyclic redundancy check (CRC) on a medium access control (MAC) layer. As compared to hybrid ARQ (H-ARQ), which is another coding technique used in the MAC layer, the fountain codes have characteristics in that error-free information may be perfectly received in a reception end without an interaction between a transmission end and the reception end. Accordingly, the fountain codes may have an advantage as compared to an H-ARQ transmission technique in which communication is performed until information is perfectly received between two ends.

To provide a video streaming service, which stably satisfies QoS, packet loss should be minimized by reducing dependency between packets delivered to minimize data loss caused by the packet loss occurring in a wireless network. An LT decoding failure rate should be reduced with the same number of packets by estimating whether a sufficient number of encoded symbols may be transmitted in an error-prone wireless network.

SUMMARY

Accordingly, example embodiments of the present invention are provided to substantially obviate one or more problems due to limitations and disadvantages of the related art.

Example embodiments of the present invention provide a method of packetizing encoded symbols by use of an AND-OR tree for minimizing packet loss.

Example embodiments of the present invention also provide an apparatus using the method of packetizing encoded symbols by use of an AND-OR tree for minimizing packet loss.

In some example embodiments, a method of packetizing encoded symbols includes: an encoded symbol and target packet selection step of deciding a first source symbol and selecting an unpacketized first encoded symbol and a target packet into which the unpacketized first encoded symbol is inserted if there is the unpacketized first encoded symbol of at least one first encoded symbol, which is an encoded symbol of the first source symbol generated using an AND-OR tree structure; and a packetization step of generating a second source symbol based on at least one unpacketized first encoded symbol by use of the AND-OR tree structure, generating at least one second encoded symbol based on the second source symbol by use of the AND-OR tree structure, and packetizing at least one of second encoded symbol into the target packet along with the first encoded symbol. The encoded symbol may be a symbol encoded using an LT. If there is no unpacketized first encoded symbol in the encoded symbol and target packet selection step and the packetization step, the encoded symbol and target packet selection step and the packetization step may be performed by designating a source symbol that is different from the first source symbol and present in the same AND-OR tree layer as that of the first source symbol as a first source symbol.

In the method, if there is no unpacketized first encoded symbol in the encoded symbol and target packet selection step and the packetization step and another source symbol is not selectable as a first source symbol, at least one of unpacketized second encoded symbols may be inserted into a remaining space of the target packet.

In the packetization step, the second encoded symbol to be packetized along with the first encoded symbol may be decided by a value satisfying an expression of:

$$R_{thr} > \frac{|RES_{TES_{sel}}| \cdot \{n_{sym} - 1 - n_{pkt} \cdot (s_{packet} - 1)\}}{n_{pkt} \cdot \{n_{sym} - |RES_{TES_{sel}}| - s_{packet}\} + |RES_{TES_{sel}}|},$$

where $n_{sym}$, denotes the number of generated encoded symbols, $n_{pkt}$ denotes the number of packets to be transmitted, $RES_{TES_{sel}}$ denotes the number of second encoded symbols, and $s_{packet}$ denotes the number of insertable encoded symbols per packet.

In the encoded symbol and target packet selection step, at least one of empty packets may be determined to be the target packet if there are the empty packets, at least one of predetermined packets having an available space of greater than $R_{thr}+1$ may be determined to be the target packet if there is no empty packet, and at least one of predetermined packets in which $R_{thr}$ is equal to or greater than $d_{TES_{sel}}-1$ and an available space is equal to or greater than $d_{TES_{sel}}$, where $d_{TES_{sel}}$ denotes a degree of the first encoded symbol, may be determined to be the target packet if the available space is not greater than $R_{thr}+1$.

In the AND-OR tree, a value obtained by carrying out an AND operation on the at least one first encoded symbol may be determined to be a value of the first source symbol, a value obtained by carrying out an OR operation on the at least one second source symbol may be determined to be a value of the first encoded symbol, and a value obtained by carrying out the AND operation on the at least one second encoded symbol may be calculated as a value of the second source symbol. The method may be used to transmit video data in a video streaming service.

In other example embodiments, an apparatus for packetizing encoded symbols includes: a tree structure generation unit configured to generate encoded symbols by use of an AND-OR tree on the basis of a source symbol, which is a target to be encoded, and generate a source symbol by use of the AND-OR tree on the basis of the encoded symbols; and a packetization unit configured to packetize at least one of the encoded symbols generated using the AND-OR tree. The packetization unit may decide a first source symbol, select an unpacketized first encoded symbol and a target packet into which the unpacketized first encoded symbol is inserted if there is the unpacketized first encoded symbol of at least one first encoded symbol, which is an encoded symbol of the first source symbol generated using an AND-OR tree structure, generate a second source symbol based on at least one unpacketized first encoded symbol by use of the AND-OR tree structure, generate at least one second encoded symbol based on the second source symbol by use of the AND-OR tree structure, and packetize at least one of second encoded symbols into the target packet along with the first encoded symbol. In the AND-OR tree, a value obtained by carrying out an AND operation on the at least one first encoded symbol may be determined to be a value of the first source symbol, a value obtained by carrying out an OR operation on the at least one second source symbol may be determined to be a value of the first encoded symbol, and a value obtained by carrying out the AND operation on the at least one second encoded symbol may be calculated as a value of the second source symbol. The packetization unit may select another first source symbol other than the first source symbol if there is no unpacketized first encoded symbol, select an unpacketized first encoded symbol if there is the unpacketized first encoded symbol among first encoded symbols, which are encoded symbols of the other first source symbol generated by use of the AND-OR tree structure, decide a target packet into which the unpacketized first encoded symbol is inserted, insert the unpacketized first encoded symbol into the target packet, generate a second source symbol based on the first encoded symbols generated using the AND-OR tree structure, generate second encoded symbols based on the second source symbol, and packetize the second encoded symbols into the target packet along with the first encoded symbols. If there is no unpacketized first encoded symbol and another first source symbol other than the first source symbol is not selectable, the packetization unit may insert at least one of unpacketized second encoded symbols into a remaining space of the target packet. The encoded symbol may be a symbol encoded using an LT. The apparatus may be used to transmit video data in a video streaming service.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Figure 1:
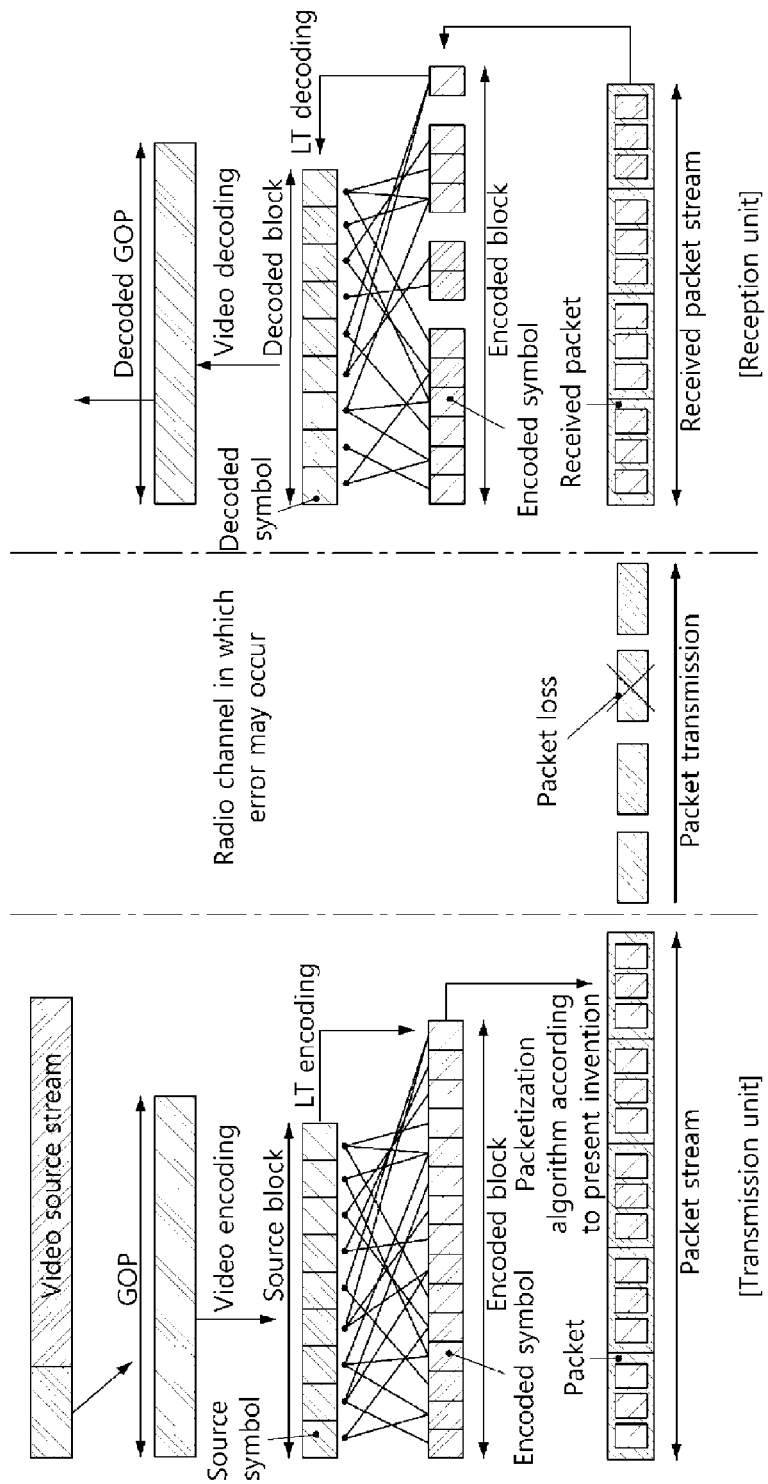
FIG. 1 shows a video streaming system in an error-prone wireless network.

Example embodiments of the present invention are disclosed herein. However, specific structural and functional details disclosed herein are merely representative for purposes of describing example embodiments of the present invention, however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method of packetizing encoded symbols by use of an LT and an apparatus using the same are disclosed as a method of packetizing encoded symbols according to example embodiments of the present invention and an apparatus using the same. However, other codes, which do not depart from the art spirit and technological essence of the present invention, as well as LT codes, are applicable to the method disclosed in the present invention. The other codes are also included in the claim scope of the present invention.

Hereinafter, the term "LT" used in the example embodiments of the present invention means a Luby transform.

FIG. 1 shows a video streaming system in an error-prone wireless network.

Referring to FIG. 1, video data compressed by a video codec is generated to reduce a volume of data. The video data is encoded using the LT for robust transmission in a wireless network. During an LT encoding process, a compressed video data stream may be divided into source blocks.

The source block may be divided into source symbols, each of which has a preset size. Encoded symbols are mapped to some source symbols. LT encoded symbols are generated by carrying out an XOR operation on source symbols.

A process of generating the LT encoded symbols is iterated until the last LT encoded symbol is generated. A procedure of mapping source symbols to LT encoded symbols may be controlled by a generator polynomial. Because many wireless networks use a packet exchanging scheme, LT encoded symbols should be packetized before transmission.

Packet loss occurring in the middle of transmission is indispensable in an error-prone wireless network. If a packet is lost, the number of received LT encoded symbols may not be sufficient for successful decoding.

If a large number of packets are continuously transmitted until a reception end obtains sufficient LT encoded symbols for successful LT decoding, error-free decoding may be ensured in an error-prone wireless network.

However, because video streaming is under delay constraint and a wireless network is a limited resource, it is actually difficult to ensure successful decoding without error. To solve this problem, it is important to estimate whether a sufficient number of encoded symbols may be transmitted through an error-prone wireless network.

Another important problem is how to reduce an LT decoding failure rate with the same number of packets. Because of dependency between encoded symbols in an iterative decoding process, the performance of LT decoding may differ according to how to packetize encoded symbols. If the dependency between encoded symbols is not considered, the performance of decoding may be seriously damaged. For example, if LT encoded symbols are irregularly grouped into a packet, a lost packet may hinder a process of successfully decoding many source symbols.

In general, video streaming data is relatively easily lost because the video streaming data is compressed at a high compression rate so as to reduce a volume of data. A small amount of lost data may lead to the serious degradation of video quality.

According to example embodiments of the present invention, an AND-OR tree is used for a relationship between LT encoded symbols so as to reduce data loss. A packetization algorithm proposed on the basis of the analysis thereof may be designed to increase a correlation between encoded symbols in each packet and decrease a correlation between packets.

Figure 2:
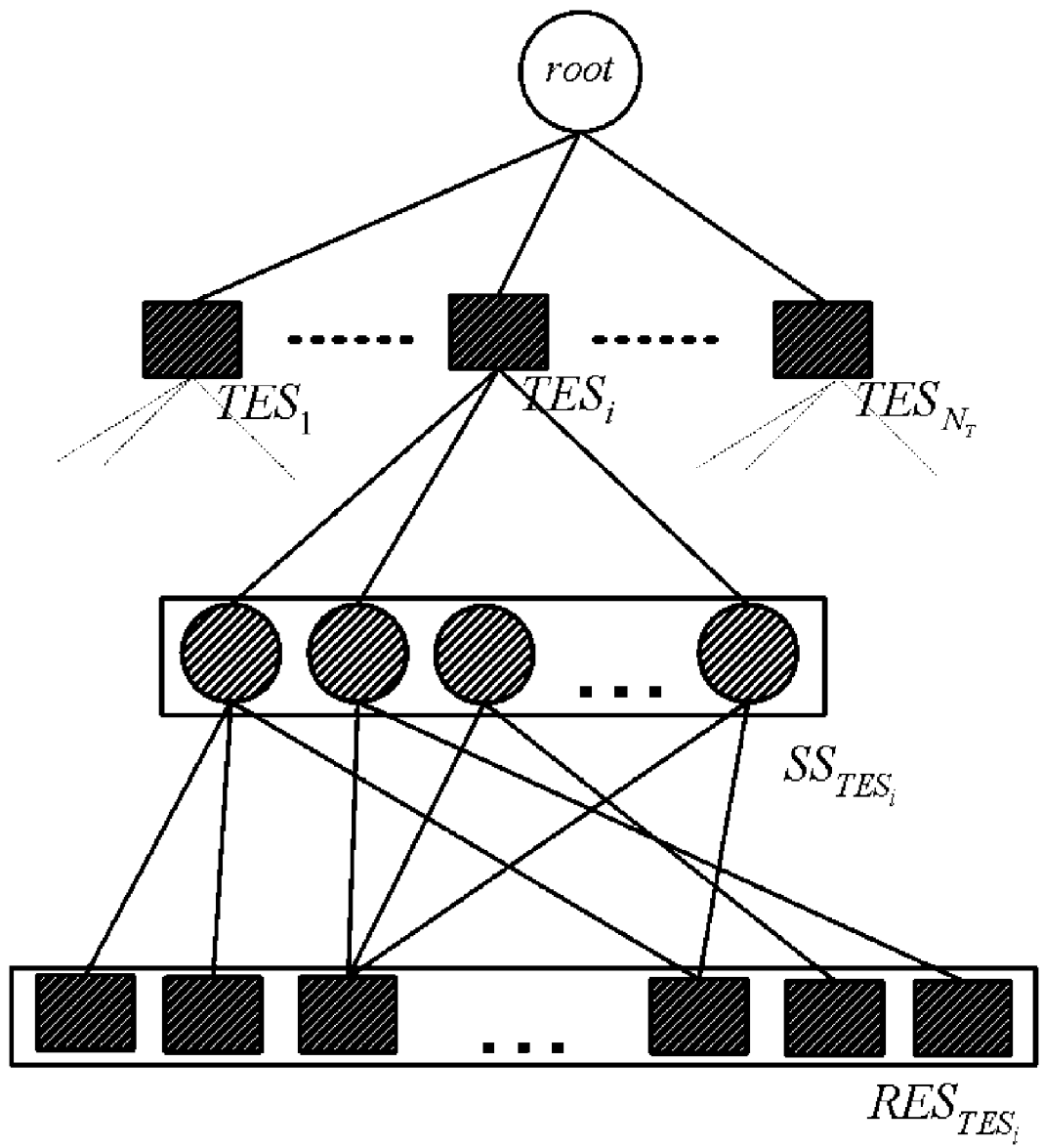
FIG. 2 is a tree structure showing an iterative encoding process between LT encoded symbols according to example embodiments of the present invention.

FIG. 2 is a tree structure showing an iterative encoding process between LT encoded symbols according to example embodiments of the present invention.

Referring to FIG. 2, a simple AND-OR tree for deriving a relationship between symbols is shown.

The AND-OR tree is a useful tool for analyzing a relationship between encoded symbols. In general, when there is an AND-OR tree $T_l$ having a depth of 2l, a depth of a root node has a value of 0 and depths of child nodes directly connected to the root node have a value of 1. A node depth is incremented by 1 in a downward direction of the tree. All nodes have a value of 0 or 1. Nodes located in depths 0, 2, 4, 2l−2 are referred to as OR nodes, and a value of the OR node is determined through an OR operation on child nodes. Nodes located in depths 1, 3, 5, 2l−1 are referred to as AND nodes, and a value of the AND node is determined through an AND operation on child nodes. If LT code symbols are mapped to the tree, source symbols are regarded as OR nodes, encoded symbols are regarded as AND nodes, and the nodes are related to each other as parent and child nodes.

The following Table 1 shows symbols used in the AND-OR tree and meanings of the symbols.

TABLE 1

| Symbol | Description |
|---|---|
| Root | Target source symbol |
| $TES_i$ | i-th target encoded symbol of root |
| $N_T$ | Number of child nodes of root |
| $d_{TES_i}$ | Degree of $TES_i$ |
| $SS_{TES_i}$ | Set of source symbols related to $TES_i$ (child nodes of $TES_i$) |
| $\lambda_j^{TES_i}$ for $1 \leq j \leq (d_{TES_i} - 1)$ | Number of links of j-th source symbol belonging to $SS_{TES_i}$ |
| $RES_{TES_i}$ | Set of encoded symbols related to $TES_i$ |
| $s_{packet}$ | Number of insertable encoded symbols per packet |

Because the root is the OR node and $TES_i$ is the AND node, all source symbols belonging to $SS_{TES_i}$ should be pre-decoded so that the root is decoded by $TES_i$, regardless of other target encoded symbols. Therefore, a process of successfully decoding the root by use of $TES_i$ is affected by encoded symbols placed in the depth 2. That is, the source symbols belonging to $SS_{TES_i}$ should be pre-decoded so that $TES_i$ contributes to successful decoding of the root.

If a reception end simultaneously receives $TES_i$ and more encoded symbols belonging to $RES_{TES_i}$, more source symbols belonging to $SS_{TES_i}$ may be decoded. Thereby, a decoding success rate of the root may be increased. This means that $TES_i$ and the encoded symbols belonging to $RES_{TES_i}$ strongly depend on each other.

If $TES_i$ is lost in a transmission process, a connection between the encoded symbols belonging to $RES_{TES_i}$ and the root is disconnected on the tree. Consequently, the encoded symbols belonging to $RES_{TES_i}$ do not contribute to decoding of the root. A relationship between these symbols should be considered to increase an LT decoding success rate. It is possible to derive the following three useful attributes on the basis of this relationship.

Attribute 1: A decoding success rate of the root may be improved by inserting $\{TES_i, 1 \leq i \leq N_T\}$ into different packets.

Attribute 2: A decoding success rate of source symbols belonging to $SS_{TES_i}$ may be improved if more encoded symbols belonging to $RES_{TES_i}$ are available.

Attribute 3: A decoding success rate of the root may be improved by inserting $TES_i$ and the encoded symbols belonging to $RES_{TES_i}$ into the same packet.

In this regard, when $RES_{TES_i}(root_p)$ and $RES_{TES_j}(root_q)$ are encoded symbol sets related to $TES_i$ and $TES_j$, where $i \neq j$ or $p \neq q$ and source symbols p and q are the roots, $RES_{TES_i}(root_p) \cap RES_{TES_j}(root_q)$ may not be a null set. That is, some LT encoded symbols may be simultaneously included in different sets.

An analysis requiring very high computational complexity is necessary to completely control dependency between trees in a packetization process with an indirect consideration of dependency between AND-OR trees by adjusting the number of encoded symbols belonging to $RES_{TES_i}$ to be inserted together into a packet to which $TES_i$ belongs.

Hereinafter, although an analysis depth of the AND-OR tree limited to 3 will be described for convenience of description in the method of packetizing LT encoded symbols by use of the AND-OR tree according to example embodiments of the present invention, the AND-OR tree may have a depth of 3 or more. A method of packetizing LT encoded symbols by use of the AND-OR tree having the depth of 3 or more is also included in the claim scope of the present invention.

Hereinafter, according to example embodiments of the present invention, a source symbol arranged in the top of a tree structure may be defined and used as a first source symbol, an encoded symbol generated from the first source symbol by use of the AND-OR tree may be defined and used as a first encoded symbol, a source symbol generated from the first encoded symbol by use of the AND-OR tree may be defined and used as a second source symbol, and an encoded symbol generated from the second source symbol by use of the AND-OR tree may be defined and used as a second encoded symbol.

That is, if a tree depth is increased, a source symbol arranged in the top of a generalized tree structure may be defined and used as an n-th source symbol, an encoded symbol generated from the n-th source symbol by use of the AND-OR tree may be defined and used as an n-th encoded symbol, a source symbol generated from the n-th encoded symbol by use of the AND-OR tree may be defined and used as an (n+1)-th source symbol, and an encoded symbol generated from the (n+1)-th source symbol by use of the AND-OR tree may be defined and used as an (n+1)-th encoded symbol.

Figure 3:
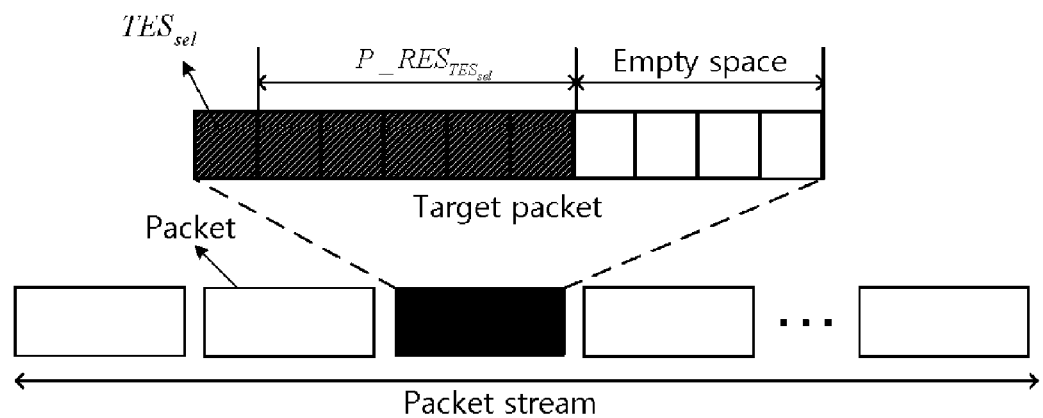
FIG. 3 is a conceptual diagram showing a method of packetizing LT encoded symbols by use of an AND-OR tree according to example embodiments of the present invention.

FIG. 3 is a conceptual diagram showing a method of packetizing LT encoded symbols by use of an AND-OR tree according to example embodiments of the present invention.

Hereinafter, a tree depth limited to 3 will be described for convenience of description. However, a tree depth may have a value of more than 3 without departing from the art spirit and technological essence of the present invention. A packetization method using this tree structure is also included in the claim scope of the present invention.

Referring to FIG. 3, if $TES_{sel}$ is a target encoded symbol selected to contribute to the decoding of a root in $\{TES_i, 1 \leq i \leq N_T\}$, the packetization algorithm according to example embodiments of the present invention based on the above-described attributes is designed so that more encoded symbols belonging to $RES_{TES_{sel}}$ and $TES_{sel}$ may be inserted into the same packet. $P\_RES_{TES_{sel}}$ may be defined as encoded symbols belonging to $RES_{TES_{sel}}$ to be inserted into the same packet as $TES_{sel}$. If the packet into which $TES_{sel}$ is inserted is a target packet, the number of encoded symbols among the encoded symbols belonging to $RES_{TES_{sel}}$ to be inserted into the target packet along with $TES_{sel}$ is decided by a control variable $R_{thr}$ of the proposed packetization algorithm.

If $R_{thr}$ is 0, the proposed packetization algorithm performs the same operation as a conventional packetization algorithm. An operation of the proposed packetization algorithm is performed through the following steps.

Step 0: A root is decided.

Step 1: $d_{TES_{sel}} \leq 2$ in $\{TES_i, 1 \leq i \leq N_T\}$ of the root, and an unpacketized $TES_{sel}$ is selected. If all elements of $\{TES_i, 1 \leq i \leq N_T\}$ have already been packetized, step 4 is performed.

Step 2: $TES_{sel}$ is inserted into a target packet selected by the following rules. Rule i has a higher priority than rule (i+1). If there are no more target packets selectable by the rules, step 4 is performed.

Rule 1: If there is an empty packet, the packet is determined to be a target packet.

Rule 2: If an available space of a packet is greater than $R_{thr}+1$, the packet is determined to be the target packet.

Rule 3: If $R_{thr}$ is equal to or greater than $d_{TES_{sel}}-1$ and an available space of a packet is equal to or greater than $d_{TES_{sel}}$, the packet is determined to be the target packet.

Rule 3 is to utilize the remaining space of the packet. After the process of rules 1 and 2, a space of less than $R_{thr}+1$ may actually remain. In this case, if only the rule of $R_{thr}+1$ is followed, the remaining space may not be utilized.

For example, assuming that 10 encoded symbols may be inserted into a packet, 6 symbols ($TES_{sel}$ and 5 encoded symbols belonging to $RES_{TES_{sel}}$) are inserted into the packet when $R_{thr}$ is 5 and rule 2 is followed. Then, a space into which 4 encoded symbols are inserted remains in the packet, and the packet does not satisfy rules 1 and 2. In this case, if there is a minimum space capable of satisfying $d_{TES_{sel}}$ through rule 3, $(d_{TES_{sel}}-1)$ encoded symbols belonging to $RES_{TES_{sel}}$ may be inserted.

Step 3: $P\_RES_{TES_{sel}}$ is decided by arbitrarily selecting $R_{thr}$ encoded symbols from among the encoded symbols belonging to $RES_{TES_{sel}}$. In this regard, $(1 \leq R_{thr} \leq \min\{(S_{packet}-1), |RES_{TES_{sel}}|\})$ is satisfied when $|A|$ is the cardinality of A. As shown in FIG. 3, $P\_RES_{TES_{sel}}$ is inserted into the target packet.

That is, a first source symbol, which is a target to be encoded, may be decided. If there is an unpacketized first encoded symbol among first encoded symbols, which are encoded symbols of the first source symbol generated using an AND-OR tree structure, the first encoding symbol may be inserted into a target packet by selecting the unpacketized first encoded symbol and deciding the target packet into which the unpacketized first encoded symbol is inserted. After a second source symbol is generated on the basis of the generated first encoded symbols by use of the AND-OR tree structure, second encoded symbols may be generated on the basis of the second source symbol by use of the AND-OR tree structure. At least one of the second encoded symbols may be packetized into the target packet along with the first encoded symbols.

When a tree depth is equal to or greater than 3, an n-th source symbol, which is a target to be encoded, may be decided. If there is an unpacketized n-th encoded symbol among n-th encoded symbols, which are encoded symbols of the n-th source symbols generated using an AND-OR tree structure, the n-th encoding symbol may be inserted into a target packet by selecting the unpacketized n-th encoded symbol and deciding the target packet into which the unpacketized n-th encoded symbol is inserted. After an (n+1)-th source symbol is generated on the basis of the generated n-th encoded symbols by use of the AND-OR tree structure, (n+1)-th encoded symbols may be generated on the basis of the (n+1)-th source symbol by use of the AND-OR tree structure. At least one of the (n+1)-th encoded symbols may be packetized into the target packet along with the n-th encoded symbols.

Step 4: If a root is no longer selected, step 5 is performed. Otherwise, another root is selected and steps 1 to 3 are iterated.

Step 5: The remaining unpacketized encoded symbols are inserted into empty spaces of packets.

Figure 4:
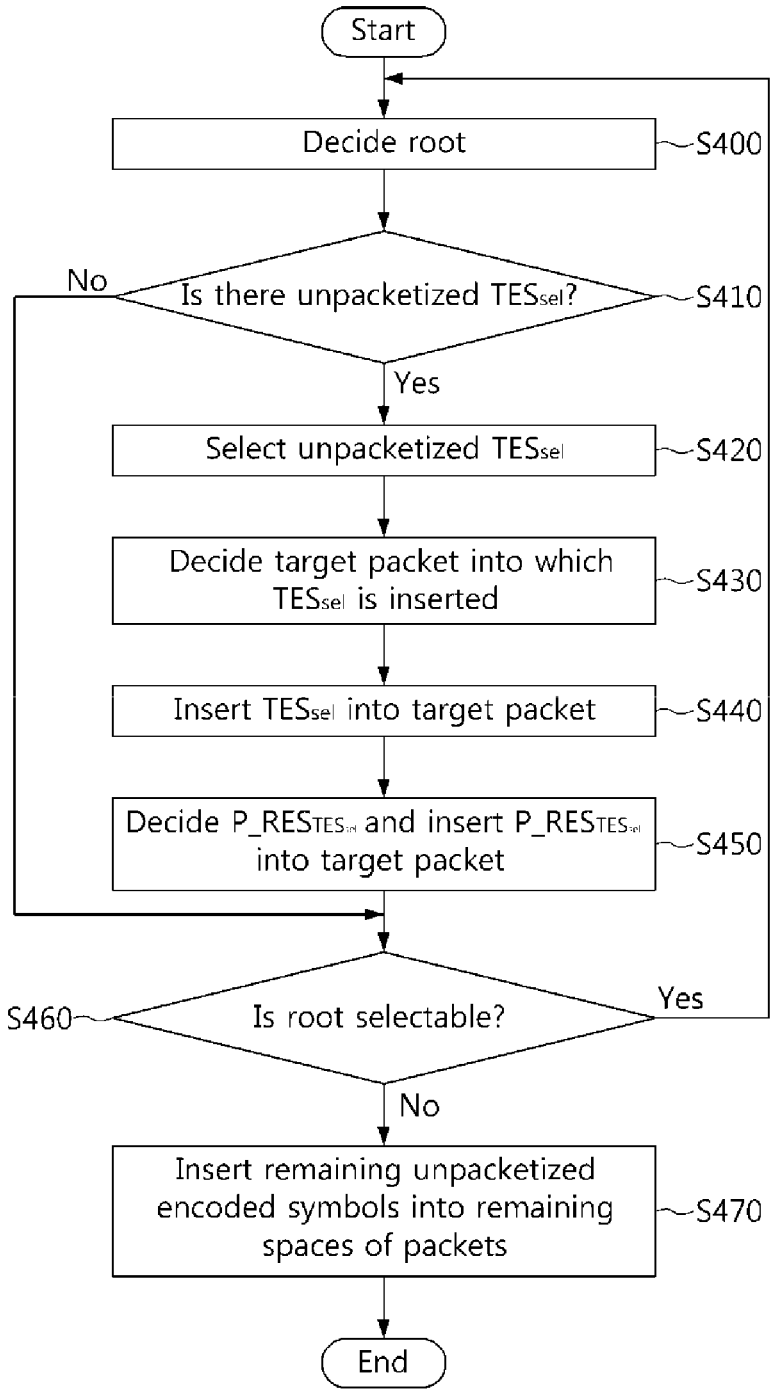
FIG. 4 is a flowchart showing the method of packetizing LT encoded symbols by use of the AND-OR tree according to example embodiments of the present invention.

FIG. 4 is a flowchart showing the method of packetizing LT encoded symbols by use of the AND-OR tree according to example embodiments of the present invention.

Referring to FIG. 4, a root may be decided (step S400).

For packetization, a root to be packetized should be preferentially decided.

It may be determined whether or not there is an unpacketized $TES_{sel}$ (step S410).

If there is no unpacketized $TES_{sel}$, it is determined whether another root is selectable in step S460. If another root is selectable, the process of step S400 in which a root is decided is iterated.

If there is no other root, the remaining encoded symbols are inserted into an empty space of the packet in step S470.

If there is an unpacketized $TES_{sel}$, the unpacketized $TES_{sel}$ may be selected (step S420).

$d_{TES_{sel}} \leq 2$ in $\{TES_i, 1 \leq i \leq N_T\}$ of the root, and the unpacketized $TES_{sel}$ is selected.

A target packet into which $TES_{sel}$ is inserted may be decided (step S430).

The target packet may be decided using the following rules to insert $TES_{sel}$ into the target packet. A rule having a small number has a higher priority than a rule having a large number.

Rule 1: If there is an empty packet, the packet is determined to be the target packet.

Rule 2: If an available space of a packet is greater than $R_{thr}+1$, the packet is determined to be the target packet.

Rule 3: If $R_{thr}$ is equal to or greater than $d_{TES_{sel}}-1$ and an available space of a packet is equal to or greater than $d_{TES_{sel}}$, the packet is determined to be the target packet.

In the above rules for deciding the target packet, rule 1 has the highest priority and rule 3 has the lowest priority. That is, a packet satisfying rule 1 is preferentially selected as the target packet.

$TES_{sel}$ may be inserted into the decided target packet (step S440).

$TES_{sel}$ is inserted into the target packet decided in step S430.

$P\_RES_{TES_{sel}}$ is decided and inserted into the target packet (step S450).

$P\_RES_{TES_{sel}}$ is decided by arbitrarily selecting $R_{thr}$ encoded symbols from among the encoded symbols belonging to $RES_{TES_{sel}}$. In this regard, $(1 \leq R_{thr} \leq \min\{(S_{packet}-1), |RES_{TES_{sel}}|\})$ is satisfied when |A| is the cardinality of A. As shown in FIG. 3, $P\_RES_{TES_{sel}}$ is inserted into the target packet.

It is determined whether or not a root is selectable (step S460).

If there is an unpacketized root, steps S400 to S450 are iterated by selecting the root.

If there is no selectable root, the remaining unpacketized encoded symbols may be inserted into the remaining empty spaces of packets (step S470).

A performance measure of an algorithm of packetizing LT encoded symbols by use of an AND-OR tree according to example embodiments of the present invention is the number of successfully received encoded symbols belonging to $RES_{TES_{sel}}$. If $R\_RES_{TES_{sel}}^{prop}$ and $R\_RES_{TES_{sel}}^{conv}$ are defined as successfully received encoded symbols belonging to $RES_{TES_{sel}}$ in a reception end when a proposed packetization algorithm and a conventional packetization algorithm are applied, it is possible to determine that the proposed packetization algorithm outperforms the conventional packetization algorithm when $|R\_RES_{TES_{sel}}^{prop}| > |R\_RES_{TES_{sel}}^{conv}|$ is satisfied.

For a performance analysis according to a packetization algorithm application, it is possible to consider two cases such as the case where $TES_{sel}$ is lost in a transmission process and the case where $TES_{sel}$ is available normally in the reception end. First, when $TES_{sel}$ is lost in the transmission process, a connection between encoded symbols belonging to $RES_{TES_i}$ and a root is disconnected, and consequently the encoded symbols belonging to $RES_{TES_i}$ do not contribute to decoding of the root. The second case is when $TES_{sel}$ is available normally in the reception end. In this case, assuming that packet loss randomly occurs, $|R\_RES_{TES_{sel}}^{prop}|$ and $|R\_RES_{TES_{sel}}^{conv}|$ may be calculated by the following Expression (1).

$$|R\_RES_{TES_{sel}}^{conv}| = \frac{|RES_{TES_{sel}}|}{n_{pkt}} + \left\{|RES_{TES_{sel}}| - \frac{|RES_{TES_{sel}}|}{n_{pkt}}\right\} \cdot (1 - PLR), \quad (1)$$

$$|R\_RES_{TES_{sel}}^{prop}| = \{R_{thr} + \alpha\} + \{|RES_{TES_{sel}}| - (R_{thr} + \alpha)\} \cdot (1 - PLR),$$

$$\alpha = \frac{|RES_{TES_{sel}}| - R_{thr}}{n_{sys} - (R_{thr} + 1)} \cdot \{s_{packet} - (R_{thr} + 1)\},$$

Here, $n_{sym}$ denotes the number of generated encoded symbols, $n_{pkt}$ denotes the number of packets to be transmitted (that is, a minimum integer, which is not less than $$\left(\text{that is, a minimum integer, which is not less than } \frac{n_{sym}}{S_{packet}}\right),$$

and $\alpha$ denotes the average number of encoded symbols belonging to $RES_{TES_{sel}}$ included in a target packet in a process in which the remaining unpacketized encoded symbols are inserted into the empty spaces of packets. PLR denotes a packet loss rate.

In order to constantly ensure $|R\_RES_{TES_{sel}}^{prop}| > |R\_RES_{TES_{sel}}^{conv}|$ on the basis of Expression (1), $R_{thr}$ should satisfy the following Expression (2).

$$R_{thr} > \frac{|RES_{TES_{sel}}|}{n_{pkt}} - \alpha \quad (2)$$

The following Expression (3) may be derived from Expressions (1) and (2).

$$R_{thr} > \frac{|RES_{TES_{sel}}| \cdot \{n_{sym} - 1 - n_{pkt} \cdot (s_{packet} - 1)\}}{n_{pkt} \cdot \{n_{sym} - |RES_{TES_{sel}}| - s_{packet}\} + |RES_{TES_{sel}}|} \quad (3)$$

In general, a degree probability distribution of LT encoded symbols is expressed by $\{\Omega_1, \ldots, \Omega_k\}$. Here, k denotes the number of source symbols, and $\Omega_i$ denotes a probability of an encoded symbol having a degree i. A degree probability distribution of LT codes is expressed by a generator polynomial of the following Expression (4).

$$\Omega(x) = \sum_{i=1}^{k} \Omega_i x^i \quad (4)$$

An average degree of encoded symbols may be expressed by $\Omega'(1)$.

Accordingly, $\lambda_j^{TES_{sel}}$ and $|RES_{TES_{sel}}|$ may be expressed as in the following Expression (5).

$$\lambda_j^{TES_{sel}} = \frac{\Omega'(1) \cdot n_{sym}}{k} = \Omega'(1) \cdot \gamma, \text{ for } 1 \leq j \leq (d_{TES_{sel}} - 1), \quad (5)$$

$$|RES_{TES_{sel}}| = \sum_{j=1}^{d_{TES_{sel}}-1} \left(\lambda_j^{TES_{sel}} - 1\right) = (\Omega'(1) - 1) \cdot (\Omega'(1) \cdot \gamma - 1)$$

Here, $\gamma$ denotes an LT encoding overhead ratio $$\left(\text{that is, } \gamma = \frac{n_{sym}}{k}\right).$$

Finally, the condition of $R_{thr}$ may be derived as in the following Expression (6) to verify that the proposed packetization algorithm outperforms the conventional packetization algorithm.

$$R_{thr} > \frac{(\Omega'(1) - 1) \cdot (\Omega'(1) \cdot \gamma - 1) \cdot \{n_{sym} - 1 - n_{pkt} \cdot (s_{packet} - 1)\}}{n_{pkt} \cdot \{n_{sym} - (\Omega'(1) - 1) \cdot (\Omega'(1) \cdot \gamma - 1) - s_{packet}\} + (\Omega'(1) - 1) \cdot (\Omega'(1) \cdot \gamma - 1)} \quad (6)$$

Figure 5:
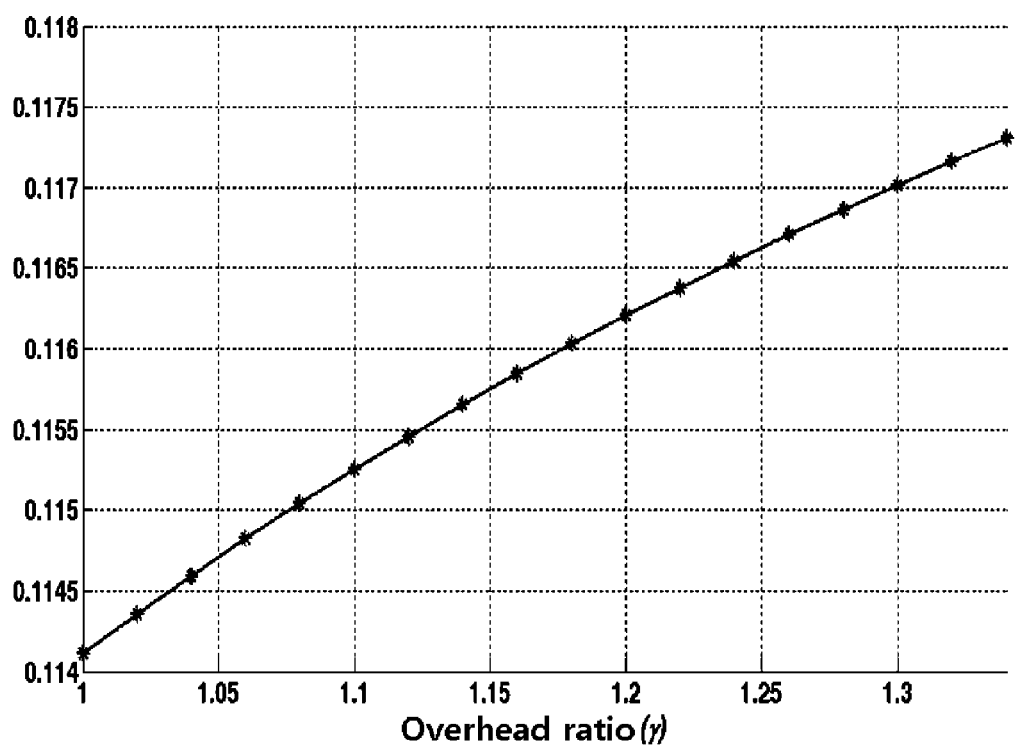
FIGS. 5 and 6 are graphs obtained by testing a condition of a control variable $R_{thr}$ of a packetization algorithm proposed according to example embodiments of the present invention.
Figure 6:
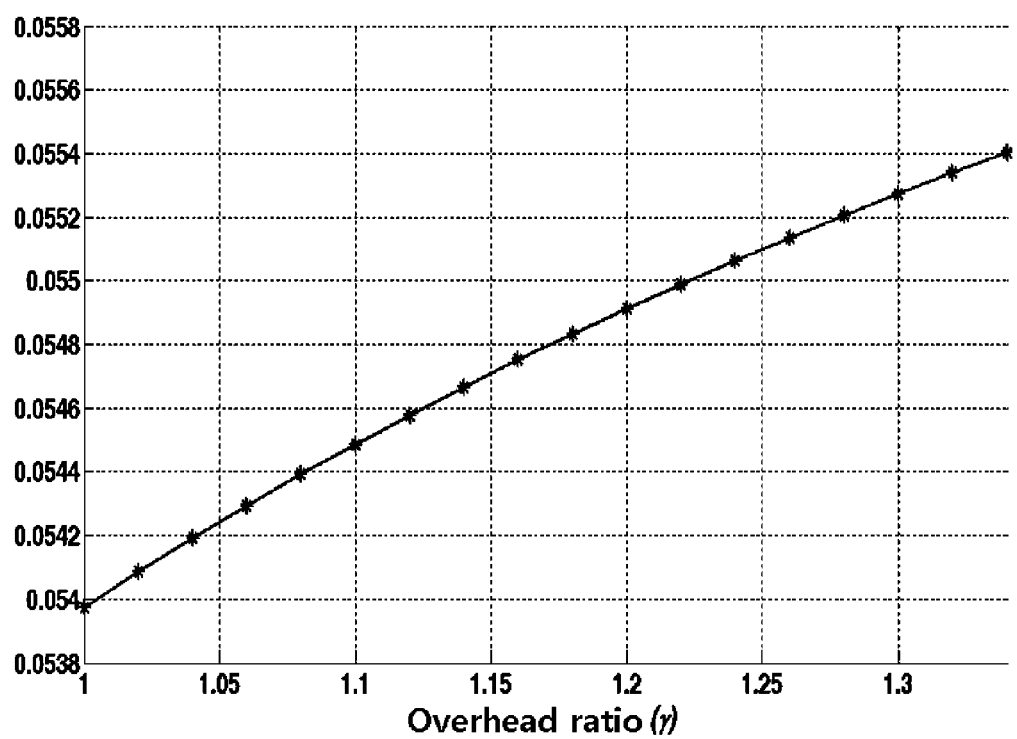

FIGS. 5 and 6 are graphs obtained by testing the condition of the control variable $R_{thr}$ of the proposed packetization algorithm according to example embodiments of the present invention.

FIG. 5 is a graph showing a lower limit of $R_{thr}$ when k=1000 and $S_{packet}$=10.

FIG. 6 is a graph showing a lower limit of $R_{thr}$ when k=2000 and $S_{packet}$=10.

Referring to FIGS. 5 and 6, it may be seen that $\gamma$ is increased when k and $S_{packet}$ of Expression (6) are fixed. As seen from FIG. 4, a lower limit of $R_{thr}$ is constantly less than 1 in a range of γ. As described in step 3 of FIG. 3, $R_{thr}$ is an integer between 1 and $\min\{(S_{packet}-1), |RES_{TES_{sel}}|\}$.

It may be seen that an algorithm for packetizing LT encoded symbols by use of an AND-OR tree according to example embodiments of the present invention has a higher LT decoding success rate than a conventional packetization algorithm in a wide range of γ.

FIGS. 7 to 10 and Table 2 show comparisons between a packetization algorithm according to example embodiments of the present invention and a conventional packetization algorithm with respect to an LT decoding failure rate when a packet loss pattern is irregular.

The following Table 2 shows a relationship between $R_{thr}$ and $|P\_RES_{TES_{sel}}|$ when k=1000 and γ=1.26.

TABLE 2

| $R_{thr}$ | $|P\_RES_{TES_{sel}}|$ | |
|---|---|---|
| | Packetization Algorithm of Present Invention (avg./standard dev.) | Conventional Packetization Algorithm (avg./standard dev.) |
| 1 | 1.105/0.662 | 0.171/0.508 |
| 3 | 1.983/1.301 | |
| 5 | 2.369/1.760 | |
| 7 | 2.614/2.320 | |
| 9 | 2.804/2.692 | |

First, the number of elements of $RES_{TES_{sel}}$ in a target packet is compared. Experiment results are provided in Table 2 and FIGS. 7 to 10.

As seen from the above Table 2, the packetization algorithm according to the example embodiments of the present invention has a larger value of $|P\_RES_{TES_{sel}}|$ than the conventional packetization algorithm, regardless of a value of $R_{thr}$. The larger the value of $R_{thr}$, the larger an average value of $|P\_RES_{TES_{sel}}|$. For example, many elements of $RES_{TES_{sel}}$ are packetized along with $TES_{sel}$ as compared to the conventional packetization algorithm. The same is also true in a standard deviation value of $|P\_RES_{TES_{sel}}|$.

An increased standard deviation means that a decoding success rate may differ according to a root. This difference is caused by dependency between trees. Actually, it is necessary to ensure the same decoding success rate in all symbols according to a relatively small standard deviation. $R_{thr}$ should be adjusted to maintain the standard deviation in an allowable range and simultaneously maximize an average value of $|P\_RES_{TES_{sel}}|$.

FIGS. 7 to 10 are graphs showing a difference in the number of elements of $RES_{TES_j}$ packetized with $TES_{sel}$ by comparing a packetization algorithm according to example embodiments of the present invention to a conventional packetization algorithm.

In the graphs of FIGS. 7 to 10, the case where $S_{packet}$ is 10 and $R_{thr}$ is fixed to 5 was assumed.

Figure 7:
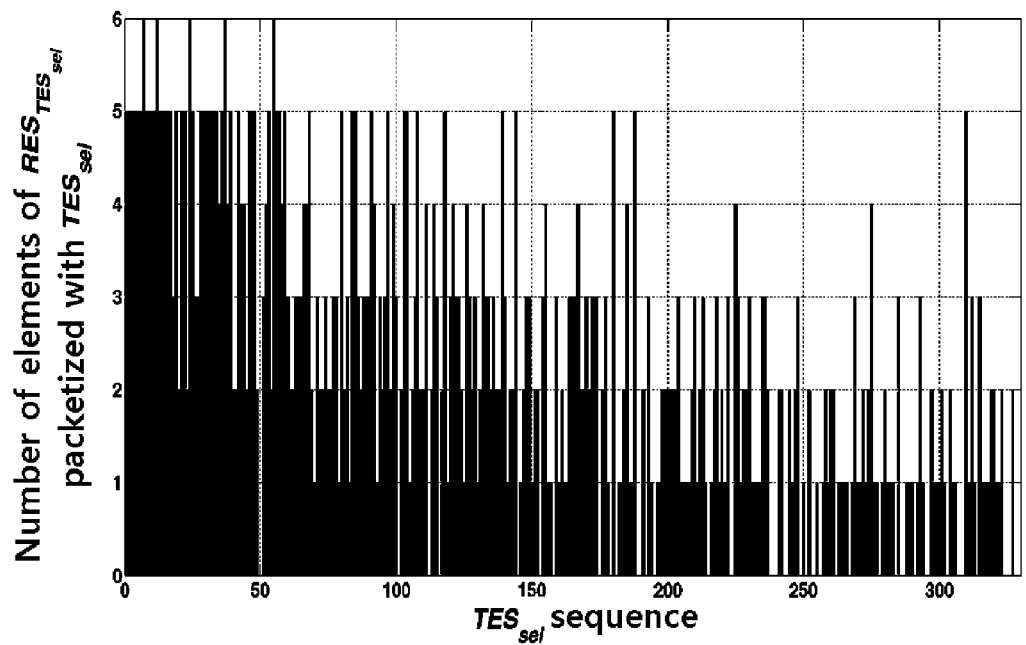
FIGS. 7 to 10 show comparisons between a packetization algorithm according to example embodiments of the present invention and a conventional packetization algorithm with respect to an LT decoding failure rate when a packet loss pattern is irregular.

FIG. 7 is a graph showing the number of elements of $RES_{TES_j}$ packetized with $TES_{sel}$ in the case where the packetization algorithm according to example embodiments of the present invention is applied when k=1000 and γ=1.26.

Figure 8:
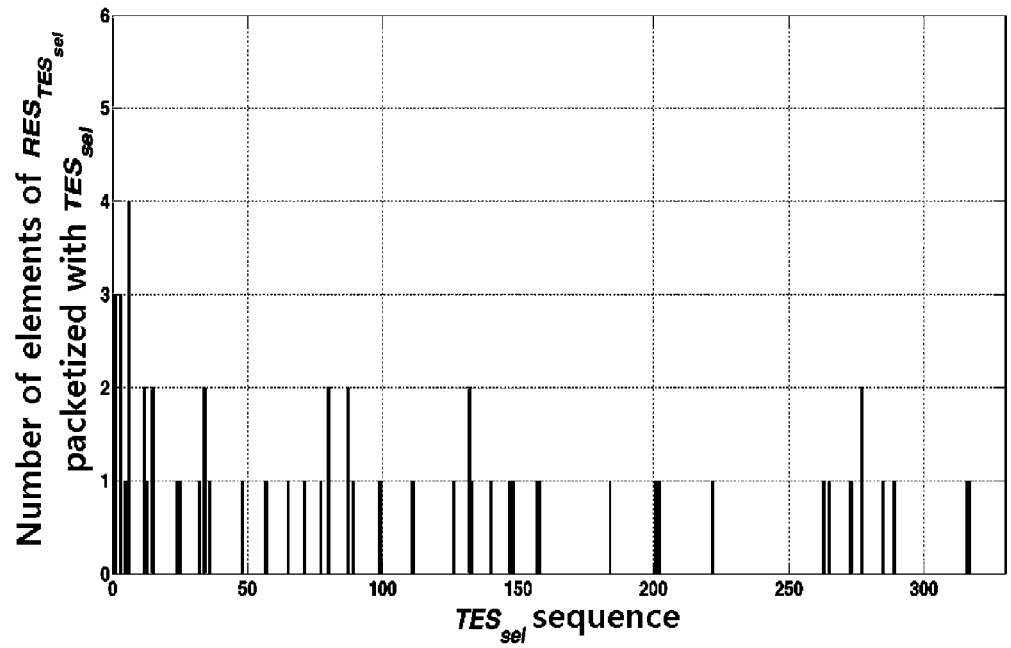

FIG. 8 is a graph showing the number of elements of $RES_{TES_j}$ packetized with $TES_{sel}$ in the case where the conventional packetization algorithm is applied when k=1000 and γ=1.26.

Figure 9:
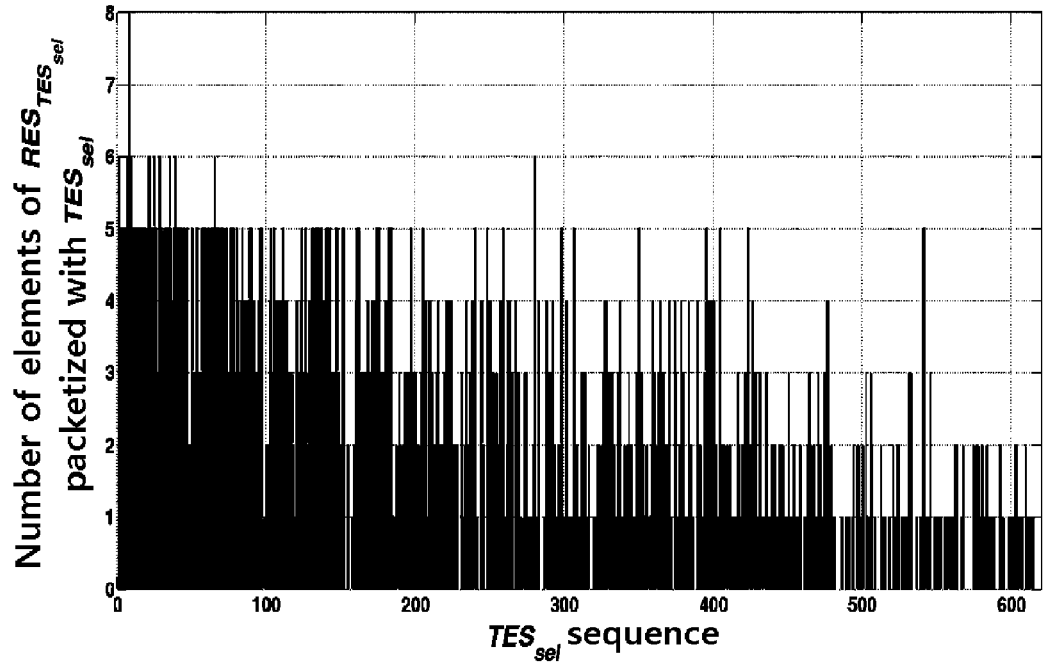

FIG. 9 is a graph showing the number of elements of $RES_{TES_j}$ packetized with $TES_{sel}$ in the case where the packetization algorithm according to example embodiments of the present invention is applied when k=2000 and γ=1.20.

Figure 10:
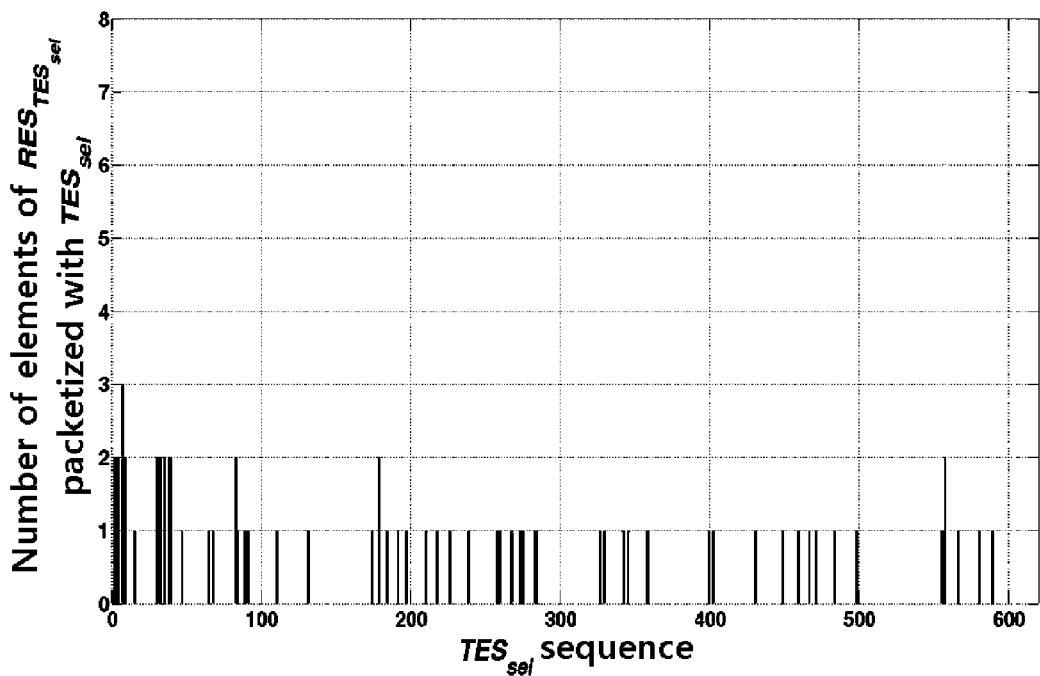

FIG. 10 is a graph showing the number of elements of $RES_{TES_j}$ packetized with $TES_{sel}$ in the case where the conventional packetization algorithm is applied when k=2000 and γ=1.20.

As seen from FIGS. 8 and 10, the number of elements of $RES_{TES_j}$ packetized with $TES_{sel}$ is uniformly distributed.

As seen from FIGS. 7 and 9, the proposed packetization algorithm outperforms the conventional packetization algorithm, despite the number of elements of $RES_{TES_j}$ packetized with $TES_{sel}$ being reduced while the proposed packetization algorithm is in progress because dependency between AND-OR trees is not considered.

In the wireless network, a packet loss pattern is shown in a concentrated form rather than in an arbitrary form. A Markov channel model having two states is applied to compare the performance of proposed packetization in an actual wireless environment. A state transition probability includes p (which is a probability of transition from a packet lossless packet state to a packet loss state) and q (which is a probability of transition from the packet loss state to the packet lossless state).

Three probability distributions shown in the following Table 3 were tested to consider various wireless networks.

TABLE 3

| | p | Q |
|---|---|---|
| Case 1 | 0.0087 | 0.1491 |
| Case 2 | 0.0120 | 0.1367 |
| Case 3 | 0.0418 | 0.5306 |

Because a large packet loss rate and a concentrated burst packet loss length very frequently occur in cases 1 and 2, γ for successful LT decoding is more increased than when the packet loss pattern is irregular.

γ required in case 3 has a value similar to when the packet loss pattern is relatively irregular.

FIGS. 11 to 14 are graphs showing comparisons between a packetization algorithm according to example embodiments of the present invention and a conventional algorithm in a transition probability distribution of case 1 when the packet loss pattern is concentrated.

In general, a decoding success rate becomes high in a reception side when more encoded symbols are received in fountain codes in a process in which packet loss occurs. Therefore, as seen from the graphs, the number of encoded symbols capable of being received by the reception side increases when an overhead ratio increases. Consequently, it may be seen that an average LT decoding failure rate tends to converge at 0. That is, all source symbols converge in a decoding direction.

The lower a source symbol recovery failure rate, the higher a peak signal-to-noise ratio (PSNR). When the proposed packetization algorithm and the conventional packetization algorithm are applied, it may be seen that the proposed packetization algorithm provides higher decoding performance and PSNR values through a performance comparison.

Figure 11:
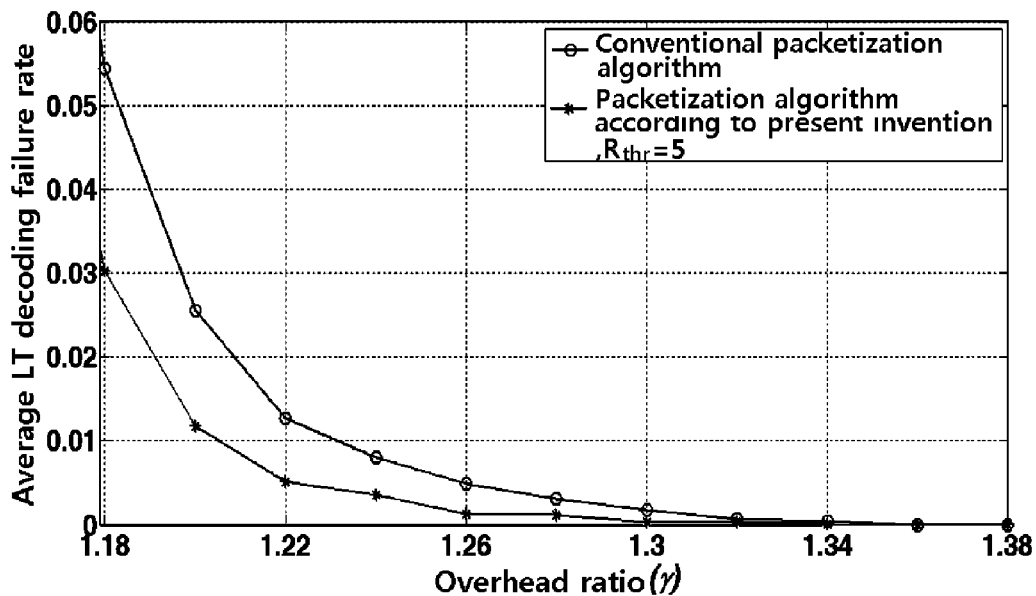
FIGS. 11 to 14 are graphs showing comparisons between a packetization algorithm according to example embodiments of the present invention and a conventional algorithm in a transition probability distribution of case 1 when the packet loss pattern is concentrated.
Figure 12:
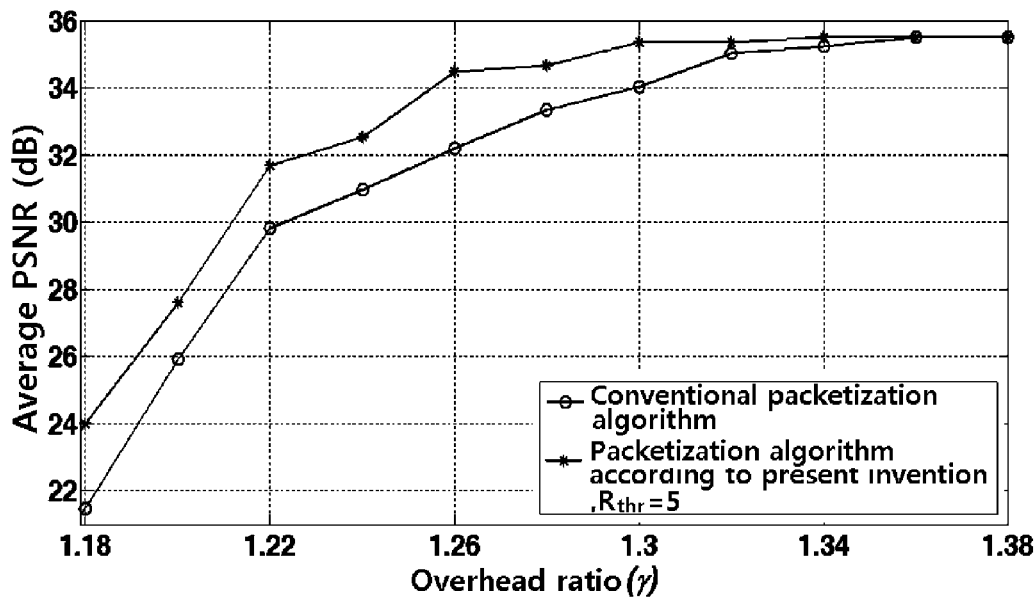

FIGS. 11 and 12 show performance comparisons through an average LT decoding failure rate and an average PSNR between the packetization algorithm according to the example embodiments of the present invention and the conventional packetization algorithm in a Harbour video when $S_{packet}$ is 10 and $R_{thr}$ is 5.

Referring to FIG. 11, the average LT decoding failure rate of the packetization algorithm according to the example embodiments of the present invention is about half lower than that of the conventional packetization algorithm when γ is a value close to 1. When γ increases, a difference between the conventional packetization algorithm and the packetization algorithm according to the example embodiments of the present invention becomes small and the decoding failure rate gradually converges on a value close to 0.

Referring to FIG. 12, the average PSNR of the proposed packetization algorithm is about 2 dB higher than that of the conventional packetization algorithm when γ is a value close to 1. It may be seen that a PSNR difference between the conventional packetization algorithm and the packetization algorithm according to the example embodiments of the present invention gradually converges when γ increases.

Figure 13:
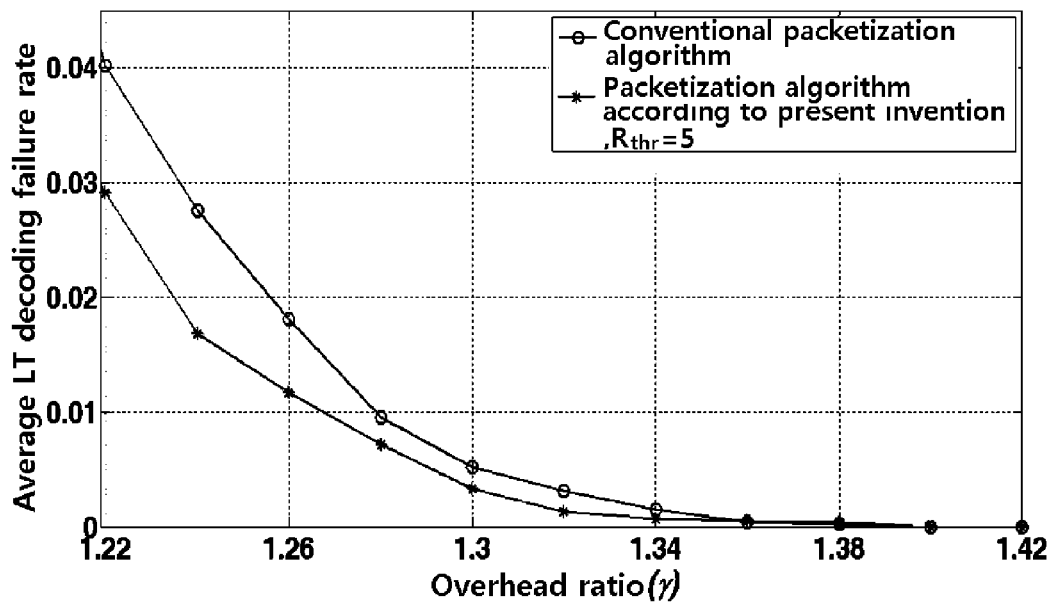
Figure 14:
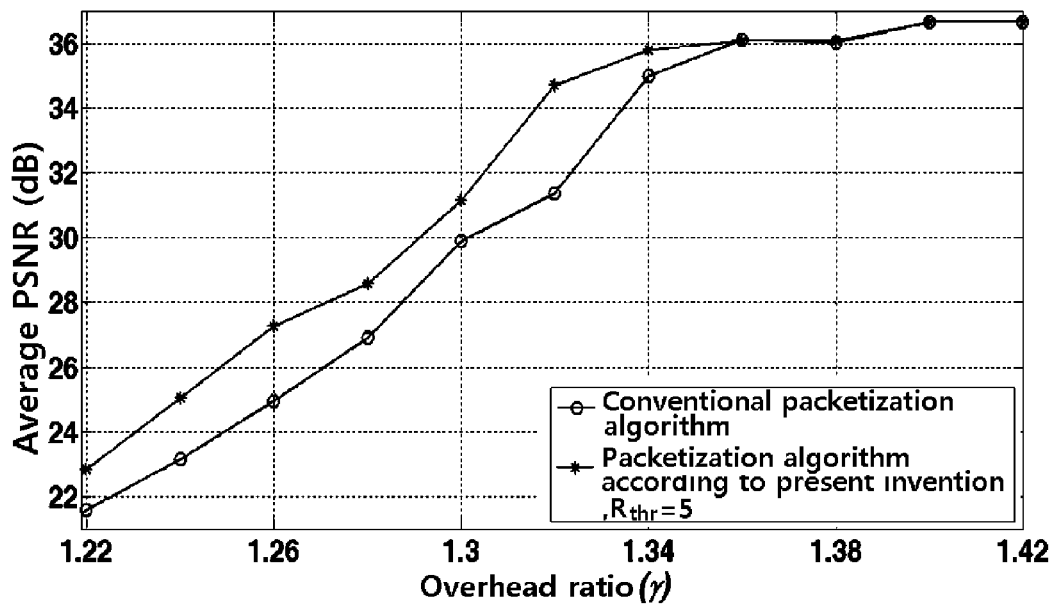

FIGS. 13 and 14 show performance comparisons through an average LT decoding failure rate and an average PSNR between the packetization algorithm according to the example embodiments of the present invention and the conventional packetization algorithm in a Soccer video when $S_{packet}$ is 10 and $R_{thr}$ is 5.

Referring to FIG. 13, the average LT decoding failure rate of the packetization algorithm according to the example embodiments of the present invention is about 0.01 lower than that of the conventional packetization algorithm when γ is a value close to 1. When γ increases, a difference between the conventional packetization algorithm and the packetization algorithm according to the example embodiments of the present invention becomes small and the decoding failure rate gradually converges on a value close to 0.

Referring to FIG. 14, the average PSNR of the packetization algorithm according to the example embodiments of the present invention is about 2 dB higher than that of the conventional packetization algorithm when γ is a value close to 1. It may be seen that a PSNR difference between the conventional packetization algorithm and the packetization algorithm according to the example embodiments of the present invention gradually converges when γ increases.

FIGS. 15 to 18 are graphs showing comparisons between a packetization algorithm according to example embodiments of the present invention and a conventional algorithm in a transition probability distribution of case 2 when the packet loss pattern is concentrated.

Figure 15:
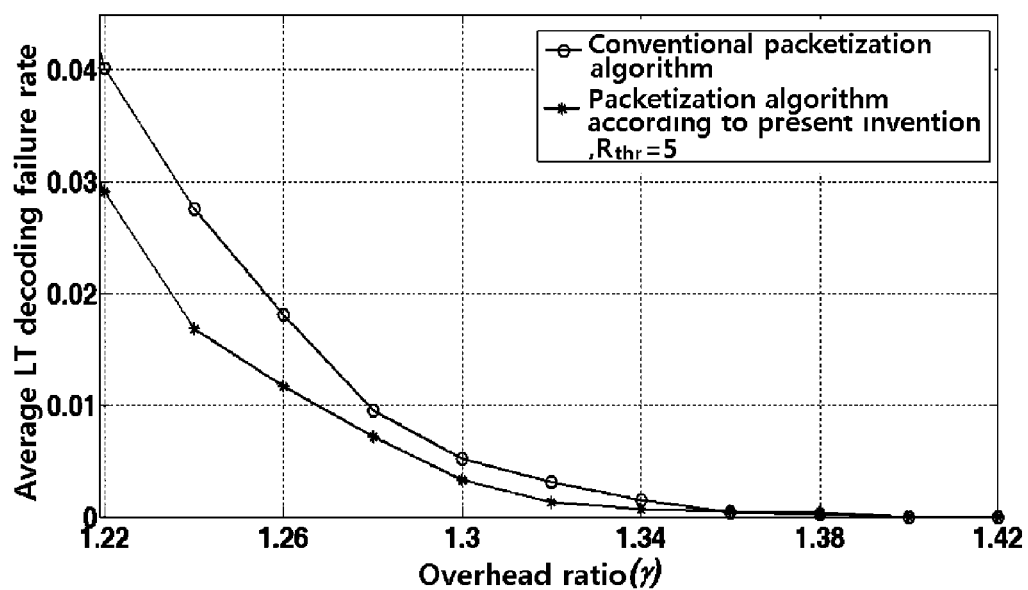
FIGS. 15 to 18 are graphs showing comparisons between a packetization algorithm according to example embodiments of the present invention and a conventional algorithm in a transition probability distribution of case 2 when the packet loss pattern is concentrated.
Figure 16:
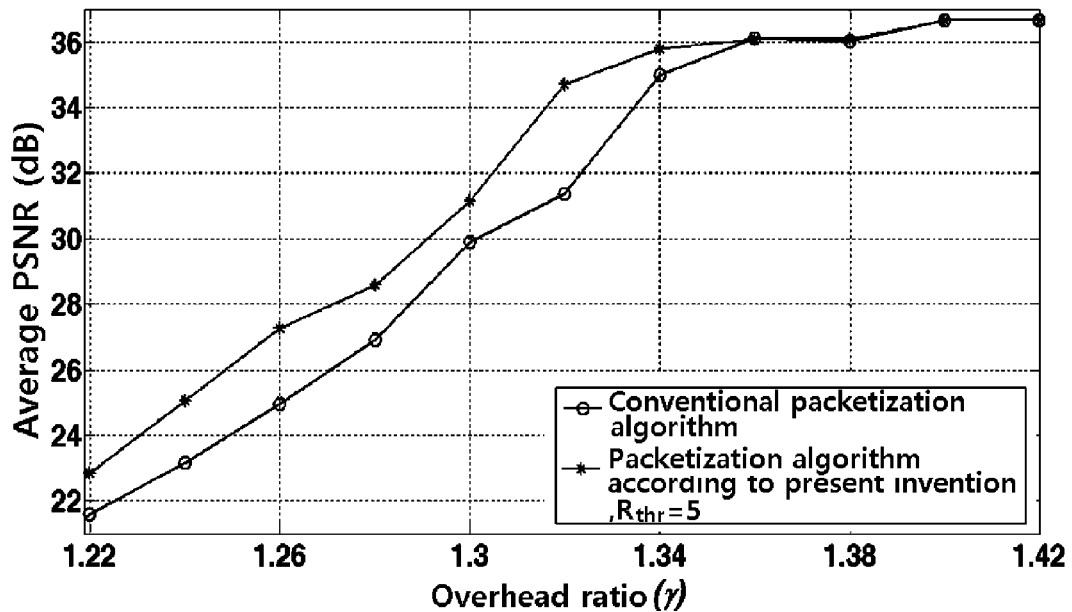

FIGS. 15 and 16 show performance comparisons through an average LT decoding failure rate and an average PSNR between the packetization algorithm according to the example embodiments of the present invention and the conventional packetization algorithm in a Harbour video when $S_{packet}$ is 10 and $R_{thr}$ is 5.

Referring to FIG. 15, the average LT decoding failure rate of the packetization algorithm according to the example embodiments of the present invention is about half lower than that of the conventional packetization algorithm when γ is a value close to 1. When γ increases, a difference between the conventional packetization algorithm and the packetization algorithm according to the example embodiments of the present invention becomes small and the decoding failure rate gradually converges on a value close to 0.

Referring to FIG. 16, the average PSNR of the packetization algorithm according to the example embodiments of the present invention is about 5 dB higher than that of the conventional packetization algorithm when γ is a value close to 1. It may be seen that a PSNR difference between the conventional packetization algorithm and the packetization algorithm according to the example embodiments of the present invention gradually converges when γ increases.

Figure 17:
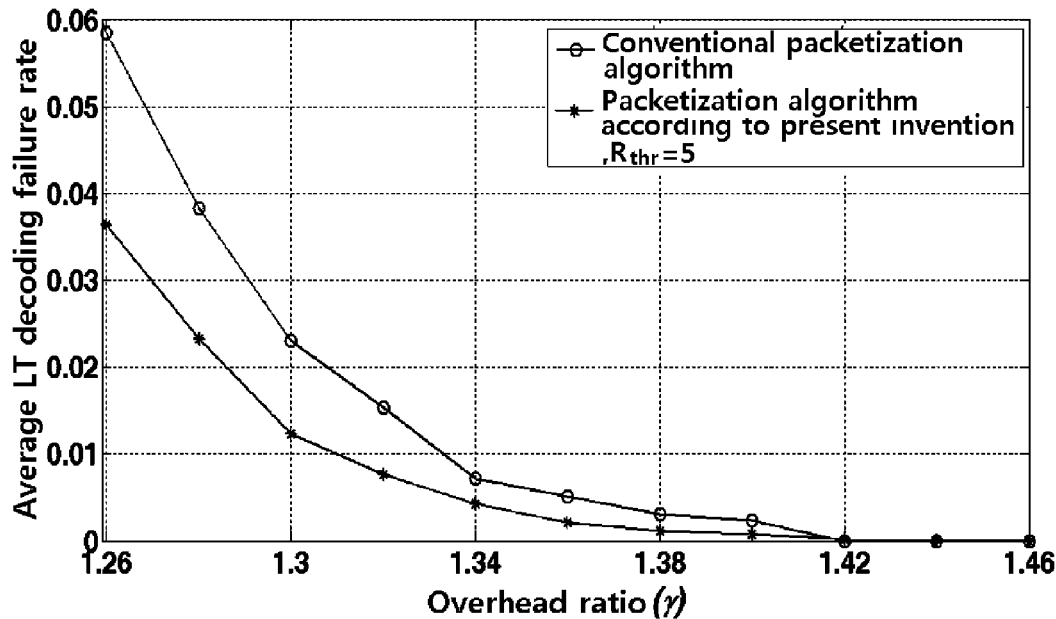
Figure 18:
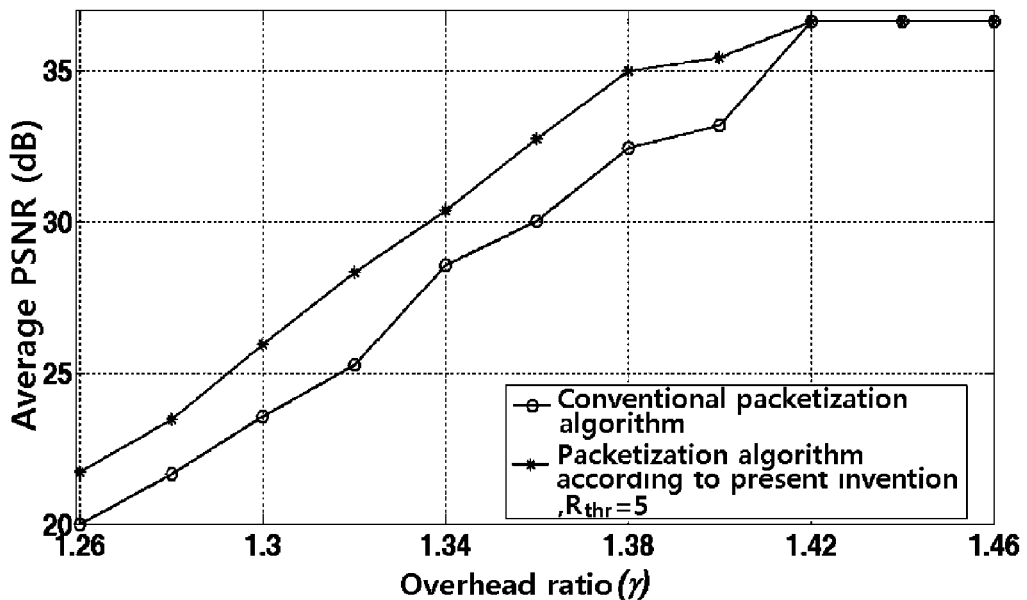

FIGS. 17 and 18 show performance comparisons through an average LT decoding failure rate and an average PSNR between the packetization algorithm according to the example embodiments of the present invention and the conventional packetization algorithm in a Soccer video when $S_{packet}$ is 10 and $R_{thr}$ is 5.

Referring to FIG. 17, the average LT decoding failure rate of the packetization algorithm according to the example embodiments of the present invention is about 0.02 lower than that of the conventional packetization algorithm when γ is a value close to 1. When γ increases, a difference between the conventional packetization algorithm and the packetization algorithm according to the example embodiments of the present invention becomes small and the decoding failure rate gradually converges on a value close to 0.

Referring to FIG. 18, the average PSNR of the packetization algorithm according to the example embodiments of the present invention is about 3 dB higher than that of the conventional packetization algorithm when γ is a value close to 1. It may be seen that a PSNR difference between the conventional packetization algorithm and the packetization algorithm according to the example embodiments of the present invention gradually converges when γ increases.

FIGS. 19 to 22 are graphs showing comparisons between a packetization algorithm according to example embodiments of the present invention and a conventional algorithm in a transition probability distribution of case 3 when the packet loss pattern is concentrated.

Figure 19:
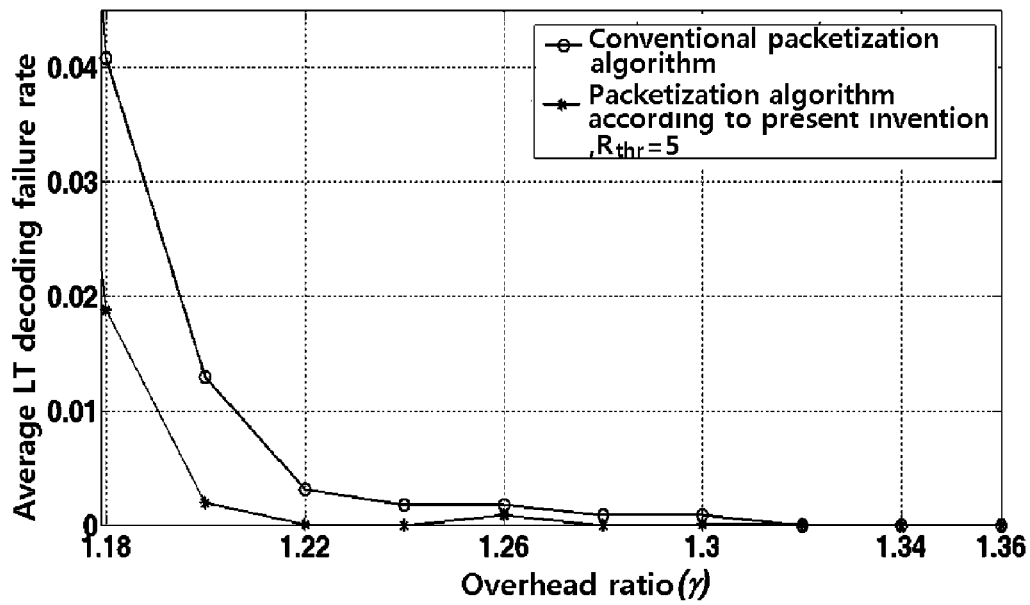
FIGS. 19 to 22 are graphs showing a comparison between a packetization algorithm according to example embodiments of the present invention and a conventional algorithm in a transition probability distribution of case 3 when the packet loss pattern is concentrated.
Figure 20:
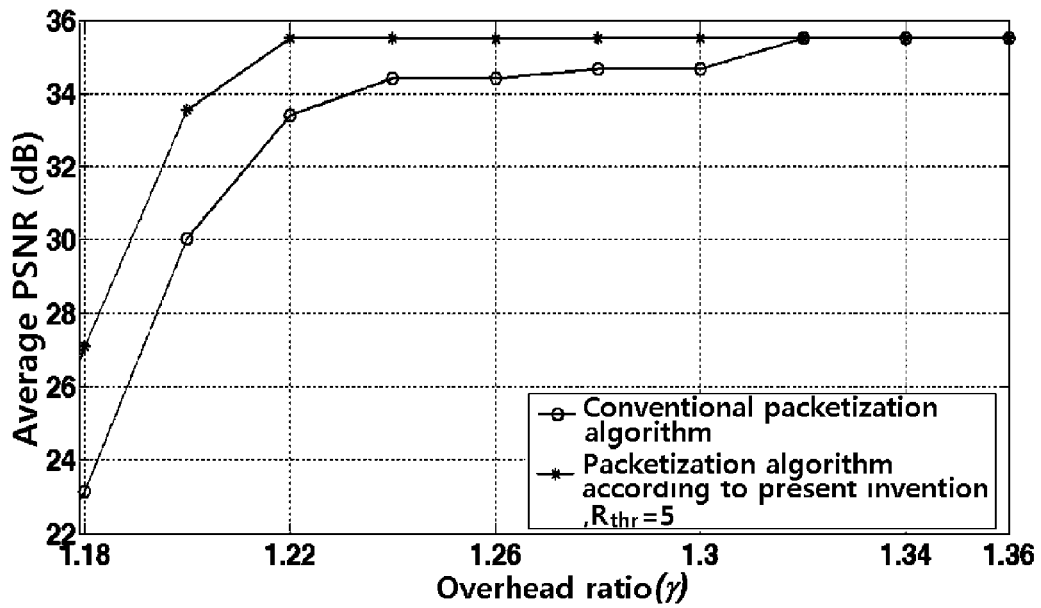

FIGS. 19 and 20 show performance comparisons through an average LT decoding failure rate and an average PSNR between the packetization algorithm according to the example embodiments of the present invention and the conventional packetization algorithm in a Harbour video when $S_{packet}$ is 10 and $R_{thr}$ is 5.

Referring to FIG. 19, the average LT decoding failure rate of the packetization algorithm according to the example embodiments of the present invention is about half lower than that of the conventional packetization algorithm when γ is a value close to 1. When γ increases, a difference between the conventional packetization algorithm and the packetization algorithm according to the example embodiments of the present invention becomes small and the decoding failure rate gradually converges on a value close to 0.

Referring to FIG. 20, the average PSNR of the packetization algorithm according to the example embodiments of the present invention is about 4 dB higher than that of the conventional packetization algorithm when γ is a value close to 1. It may be seen that a PSNR difference between the conventional packetization algorithm and the packetization algorithm according to the example embodiments of the present invention gradually converges when γ increases.

Figure 21:
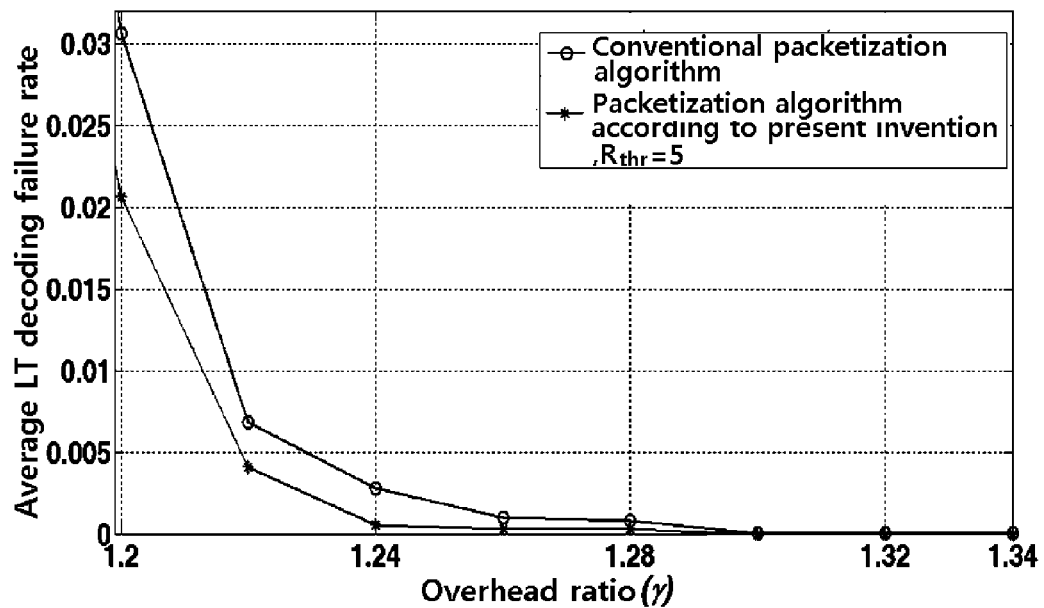
Figure 22:
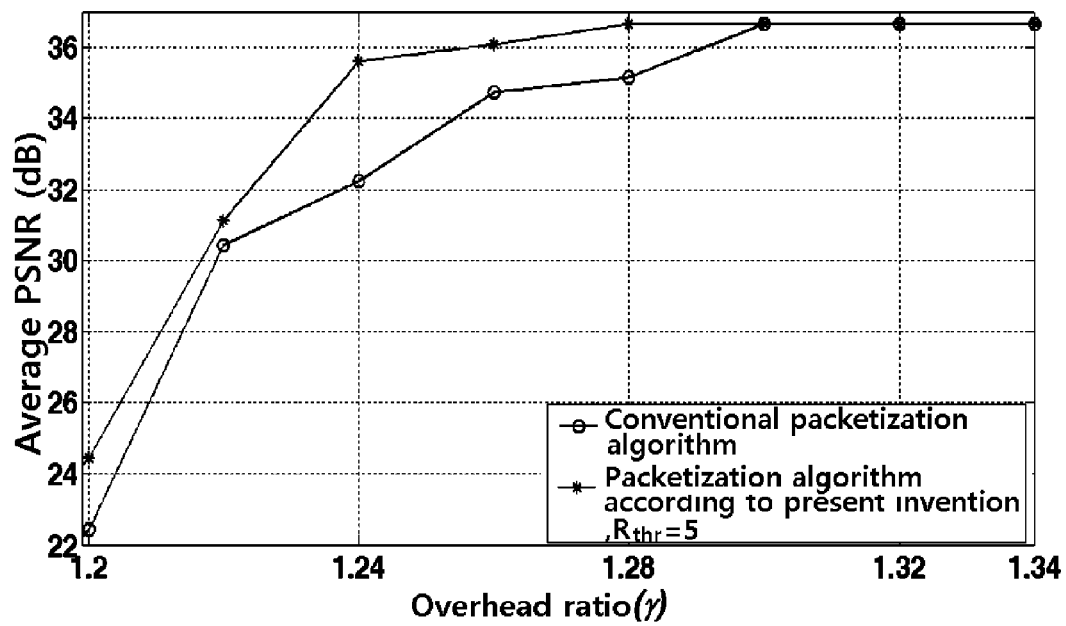

FIGS. 21 and 22 show performance comparisons through an average LT decoding failure rate and an average PSNR between the packetization algorithm according to the example embodiments of the present invention and the conventional packetization algorithm in a Soccer video when $S_{packet}$ is 10 and $R_{thr}$ is 5.

Referring to FIG. 21, the average LT decoding failure rate of the packetization algorithm according to the example embodiments of the present invention is about 0.01 lower than that of the conventional packetization algorithm when γ is a value close to 1. When γ increases, a difference between the conventional packetization algorithm and the packetization algorithm according to the example embodiments of the present invention becomes small and the decoding failure rate gradually converges on a value close to 0.

Referring to FIG. 22, the average PSNR of the packetization algorithm according to the example embodiments of the present invention is about 3 dB higher than that of the conventional packetization algorithm when γ is a value close to 1.

It may be seen that a PSNR difference between the conventional packetization algorithm and the packetization algorithm according to the example embodiments of the present invention gradually converges when γ increases.

Figure 23:
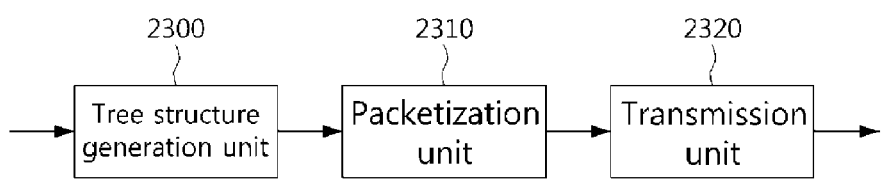
FIG. 23 is a conceptual diagram showing an apparatus for packetizing and transmitting encoded symbols according to example embodiments of the present invention.

FIG. 23 is a conceptual diagram showing an apparatus for packetizing and transmitting encoded symbols according to example embodiments of the present invention.

Referring to FIG. 23, the apparatus for packetizing and transmitting encoded symbols may include a tree structure generation unit 2310, a packetization unit 2310, and a transmission unit 2320.

The tree structure generation unit 2300 may generate a tree structure using an AND-OR tree based on source symbols.

The AND-OR tree is a useful tool for analyzing a relationship between encoded symbols. In general, when there is an AND-OR tree $T_l$ having a depth of 2l, a depth of a root node has a value of 0 and depths of child nodes directly connected to the root node have a value of 1. A node depth is incremented by 1 in a downward direction of the tree. All nodes have a value of 0 or 1. Nodes located in depths 0, 2, 4, ..., 2l−2 are referred to as OR nodes, and a value of the OR node is determined through an OR operation on child nodes. Nodes located in depths 1, 3, 5, ..., 2l−1 are referred to as AND nodes, and a value of the AND node is determined through an AND operation on child nodes. If LT code symbols are mapped to the tree, source symbols are regarded as OR nodes, encoded symbols are regarded as AND nodes, and the nodes are related to each other as parent and child nodes.

It is possible to generate a tree structure using an AND-OR tree based on source symbols by use of the tree structure according to the example embodiments of the present invention shown in FIG. 2.

Although analysis depths of the AND-OR tree limited to 3 have been described above for convenience of description in the method of packetizing LT encoded symbols by use of the AND-OR tree according to example embodiments of the present invention, the AND-OR tree may have a depth of 3 or more. A method of packetizing LT encoded symbols by use of the AND-OR tree having the depth of 3 or more is also included in the claim scope of the present invention.

The packetization unit 2310 may packetize encoded symbols on the basis of tree structure information provided from the tree structure generation unit 2300. It is possible to perform a packetization process with an indirect consideration of dependency between AND-OR trees by adjusting the number of encoded symbols belonging to $RES_{TES_i}$ to be inserted together into a packet to which $TES_i$ belongs.

The transmission unit 2320 may transmit a packet generated by the packetization unit by use of a communication channel.

Because video streaming is under delay constraint and a wireless network is a limited resource, it is actually difficult to ensure successful decoding without error. To solve this problem, it is important to estimate whether a sufficient number of encoded symbols may be transmitted through an error-prone wireless network.

Accordingly, if a packetization method using an AND-OR tree according to example embodiments of the present invention is used, the present invention may be particularly effectively utilized in a method of transmitting video data compressed by a video codec by use of packetization.

According to a method of packetizing encoded symbols and an apparatus using the same according to the example embodiments of the present invention, encoded symbols based on an AND-OR tree are packetized for the sake of a video streaming service in a wireless network. First, a relationship between encoded symbols may be analyzed using the AND-OR tree. The effect of packet loss during data transmission may be regionally limited using a method of reducing a correlation between packets for symbols encoded on the basis of an analysis result.

Accordingly, it is possible to minimize packet loss occurring in the wireless network, and particularly, to minimize the degradation of quality of the video streaming service and provide a video streaming service stably satisfying QoS by reducing dependency between packets to be delivered.

While the example embodiments of the present invention and their advantages have been described in detail, it should be understood that various changes, substitutions and alterations may be made herein without departing from the scope of the invention.

What is claimed is:

1. A method of packetizing encoded symbols comprising:
an encoded symbol and target packet selection step of deciding a first source symbol and selecting an unpacketized first encoded symbol and a target packet into which the unpacketized first encoded symbol is inserted if there is the unpacketized first encoded symbol of at least one first encoded symbol, which is an encoded symbol of the first source symbol generated using an AND-OR tree structure; and
a packetization step of generating a second source symbol based on at least one unpacketized first encoded symbol by use of the AND-OR tree structure, generating at least one second encoded symbol based on the second source symbol by use of the AND-OR tree structure, and packetizing at least one of second encoded symbols into the target packet along with the first encoded symbol,
wherein, in the AND-OR tree, a value obtained by carrying out an AND operation on the at least one first encoded symbol is determined to be a value of the first source symbol, a value obtained by carrying out an OR operation on the at least one second source symbol is determined to be a value of the first encoded symbol, and a value obtained by carrying out the AND operation on the at least one second encoded symbol is calculated as a value of the second source symbol.

2. The method of claim 1, wherein the encoded symbol is a symbol encoded using a Luby transform (LT).

3. The method of claim 1, wherein, if there is no unpacketized first encoded symbol in the encoded symbol and target packet selection step and the packetization step, the encoded symbol and target packet selection step and the packetization step are performed by designating a source symbol that is different from the first source symbol and present in the same AND-OR tree layer as that of the first source symbol as a first source symbol.

4. The method of claim 1, wherein, if there is no unpacketized first encoded symbol in the encoded symbol and target packet selection step and the packetization step and another source symbol is not selectable as a first source symbol, at least one of unpacketized second encoded symbols is inserted into a remaining space of the target packet.

5. The method of claim 1, wherein, in the packetization step, the second encoded symbol to be packetized along with the first encoded symbol is decided by a value satisfying an expression of:

$$R_{thr} > \frac{|RES_{TES_{sel}}| \cdot \{n_{sym} - 1 - n_{pkt} \cdot (s_{packet} - 1)\}}{n_{pkt} \cdot \{n_{sym} - |RES_{TES_{sel}}| - s_{packet}\} + |RES_{TES_{sel}}|},$$

where $n_{sym}$ denotes the number of generated encoded symbols, $n_{pkt}$ denotes the number of packets to be transmitted, $RES_{TES_{sel}}$ denotes the number of second encoded symbols, and $s_{packet}$ denotes the number of insertable encoded symbols per packet.

6. The method of claim 5, wherein, in the encoded symbol and target packet selection step, at least one of empty packets is determined to be the target packet if there are the empty packets, at least one of predetermined packets having an available space of greater than $R_{thr}+1$ is determined to be the target packet if there is no empty packet, and at least one of predetermined packets in which $R_{thr}$ is equal to or greater than $d_{TES_{sel}}-1$ and an available space is equal to or greater than $d_{TES_{sel}}$, where $d_{TES_{sel}}$ denotes a degree of the first encoded symbol, is determined to be the target packet if the available space is not greater than $R_{Thr}+1$.

7. The method of claim 1, wherein the method is used to transmit video data in a video streaming service.

8. An apparatus for packetizing encoded symbols comprising:
a tree structure generation unit configured to generate encoded symbols by use of an AND-OR tree on the basis of a source symbol, which is a target to be encoded, and generate a source symbol by use of the AND-OR tree on the basis of the encoded symbols; and
a packetization unit configured to packetize at least one of the encoded symbols generated using the AND-OR tree,
wherein, in the AND-OR tree, a value obtained by carrying out an AND operation on the at least one first encoded symbol is determined to be a value of the first source symbol, a value obtained by carrying out an OR operation on the at least one second source symbol is determined to be a value of the first encoded symbol, and a value obtained by carrying out the AND operation on the at least one second encoded symbol is calculated as a value of the second source symbol.

9. The apparatus of claim 8, wherein the packetization unit decides a first source symbol, selects an unpacketized first encoded symbol and a target packet into which the unpacketized first encoded symbol is inserted if there is the unpacketized first encoded symbol of at least one first encoded symbol, which is an encoded symbol of the first source symbol generated using an AND-OR tree structure, generates a second source symbol based on at least one unpacketized first encoded symbol by use of the AND-OR tree structure, generates at least one second encoded symbol based on the second source symbol by use of the AND-OR tree structure, and packetizes at least one of second encoded symbols into the target packet along with the first encoded symbol.

10. The apparatus of claim 8, wherein the packetization unit selects another first source symbol other than the first source symbol if there is no unpacketized first encoded symbol, selects an unpacketized first encoded symbol if there is the unpacketized first encoded symbol among first encoded symbols, which are encoded symbols of the other first source symbol generated by use of the AND-OR tree structure, decides a target packet into which the unpacketized first encoded symbol is inserted, inserts the unpacketized first encoded symbol into the target packet, generates a second source symbol based on the first encoded symbols generated using the AND-OR tree structure, generates second encoded symbols based on the second source symbol, and packetizes the second encoded symbols into the target packet along with the first encoded symbols.

11. The apparatus of claim 8, wherein, if there is no unpacketized first encoded symbol and another first source symbol other than the first source symbol is not selectable, the packetization unit inserts at least one of unpacketized second encoded symbols into a remaining space of the target packet.

12. The apparatus of claim 8, wherein the encoded symbol is a symbol encoded using an LT.

13. The apparatus of claim 8, wherein the apparatus is used to transmit video data in a video streaming service.

* * * * *